(12) United States Patent
Soto et al.

(10) Patent No.: US 12,104,955 B2
(45) Date of Patent: Oct. 1, 2024

(54) DEVICE TO PROCESS SAMPLE USING A TIME-WINDOWED TRANSFORM FUNCTION TO GENERATE SPECTRAL DATA AND TO USE COMBINED MAGNITUDE AND PHASE SPECTROGRAMS

(71) Applicant: THE BOEING COMPANY, Chicago, IL (US)

(72) Inventors: Ely V. Soto, Lorton, VA (US); Aleksandar Jovancevic, Clifton, VA (US)

(73) Assignee: THE BOEING COMPANY, Arlington, VA (US)

( * ) Notice: Subject to any disclaimer, the term of this patent is extended or adjusted under 35 U.S.C. 154(b) by 392 days.

(21) Appl. No.: 17/649,944

(22) Filed: Feb. 4, 2022

(65) Prior Publication Data

US 2022/0276094 A1 Sep. 1, 2022

Related U.S. Application Data

(60) Provisional application No. 63/154,897, filed on Mar. 1, 2021.

(51) Int. Cl.
| | |
|---|---|
| *G01J 3/40* | (2006.01) |
| *G01R 23/16* | (2006.01) |
| *G06N 3/04* | (2023.01) |
| *G06T 7/00* | (2017.01) |
| *G01J 3/28* | (2006.01) |
| *G06N 20/00* | (2019.01) |

(52) U.S. Cl.
CPC ............ *G01J 3/40* (2013.01); *G01R 23/16* (2013.01); *G06N 3/04* (2013.01); *G06T 7/0002* (2013.01); *G01J 3/2823* (2013.01); *G06N 20/00* (2019.01); *G06T 2207/20084* (2013.01)

(58) Field of Classification Search
None
See application file for complete search history.

(56) References Cited

U.S. PATENT DOCUMENTS

| | | | |
|---|---|---|---|
| 9,791,508 B2 | 10/2017 | Smith | |
| 10,863,261 B1 * | 12/2020 | Chen | .......... H04R 1/1041 |
| 2006/0167683 A1 * | 7/2006 | Hoerich | .......... G10L 19/24 |
| | | | 704/E19.044 |
| 2011/0158426 A1 * | 6/2011 | Matsuo | .......... H04R 3/005 |
| | | | 381/94.1 |
| 2012/0140287 A1 * | 6/2012 | Kawaguchi | ..... G06K 15/1817 |
| | | | 358/1.16 |
| 2017/0205460 A1 * | 7/2017 | Smith | .......... G01N 29/46 |
| 2019/0293429 A1 | 9/2019 | Cameron et al. | |
| 2019/0294200 A1 | 9/2019 | Cameron et al. | |

* cited by examiner

*Primary Examiner* — Haris Sabah
(74) *Attorney, Agent, or Firm* — Moore IP Law

(57) ABSTRACT

A method of signal processing includes receiving samples of a signal and processing the samples using a time-windowed transform function to generate spectral data corresponding to each time window. The method includes generating first spectrogram data based on magnitudes of the spectral data and generating second spectrogram data based on phase differences of the spectral data. The method further includes combining the first spectrogram data and the second spectrogram data to generate a combined spectrogram and processing the combined spectrogram to generate output.

20 Claims, 10 Drawing Sheets

DEVICE TO PROCESS SAMPLE USING A TIME-WINDOWED TRANSFORM FUNCTION TO GENERATE SPECTRAL DATA AND TO USE COMBINED MAGNITUDE AND PHASE SPECTROGRAMS

CROSS-REFERENCE TO RELATED APPLICATIONS

The present application claims priority from U.S. Provisional Patent Application No. 63/154,897 entitled "COMBINED MAGNITUDE AND PHASE SPECTROGRAMS," filed Mar. 1, 2021, the contents of which are incorporated by reference in their entirety.

FIELD OF THE DISCLOSURE

The present disclosure is generally related to signal processing to generate and use combined magnitude and phase spectrograms.

BACKGROUND

Artificial intelligence techniques using neural networks and object detection networks are often used in image applications to perform localization and classification of images and portions of images. Such techniques have been applied to spectral information via processing of a two-dimensional (2D) spectrogram that is created from spectral sensor data. For example, spectral information representing a received electromagnetic signal can be processed using a neural network to classify the signal or to identify characteristics of the signal. Typically, a magnitude spectrogram is generated using spectral information associated with a received signal, such as by performing a Fourier transform of segments of the received signal to generate the spectral information across frequency and over time. However, a limitation of such techniques is that conventional discrete Fourier transforms, such as the short-time Fourier transform (STFT), produce spectral data having fixed resolution in both frequency and time. Increasing the resolution in the frequency domain reduces the resolution in the time domain, and vice-versa. In addition, because of the complexity of the resulting spectral information, magnitude spectrograms are used, enabling easier visual interpretation of the spectrograms, and phase information is typically discarded. Although spectral processing systems that use STFT and magnitude spectrograms can generate useful results, performance of such systems is ultimately limited by the loss of phase information and Fourier transform resolution limitations.

SUMMARY

In a particular implementation, a device for signal processing includes a memory configured to store instructions and also includes one or more processors. The one or more processors are configured to execute the instructions to receive samples of a signal. The one or more processors are configured to execute the instructions to process the samples using a time-windowed transform function to generate spectral data corresponding to each time window. The one or more processors are configured to execute the instructions to generate first spectrogram data based on magnitudes of the spectral data and to generate second spectrogram data based on phase differences of the spectral data. The one or more processors are also configured to execute the instructions to combine the first spectrogram data and the second spectrogram data to generate a combined spectrogram to process the combined spectrogram to generate output.

In another particular implementation, a method of signal processing includes receiving samples of a signal and processing the samples using a time-windowed transform function to generate spectral data corresponding to each time window. The method includes generating first spectrogram data based on magnitudes of the spectral data and generating second spectrogram data based on phase differences of the spectral data. The method also includes combining the first spectrogram data and the second spectrogram data to generate a combined spectrogram and processing the combined spectrogram to generate output.

In another particular implementation, a computer-readable storage device stores instructions that, when executed by one or more processors, cause the one or more processors to receive samples of a signal and to process the samples using a time-windowed transform function to generate spectral data corresponding to each time window. The instructions are executable by the one or more processors to generate first spectrogram data based on magnitudes of the spectral data and to generate second spectrogram data based on phase differences of the spectral data. The instructions are also executable by the one or more processors to combine the first spectrogram data and the second spectrogram data to generate a combined spectrogram and to process the combined spectrogram to generate output.

The features, functions, and advantages described herein can be achieved independently in various implementations or may be combined in yet other implementations, further details of which can be found with reference to the following description and drawings.

DETAILED DESCRIPTION

Figure 1:
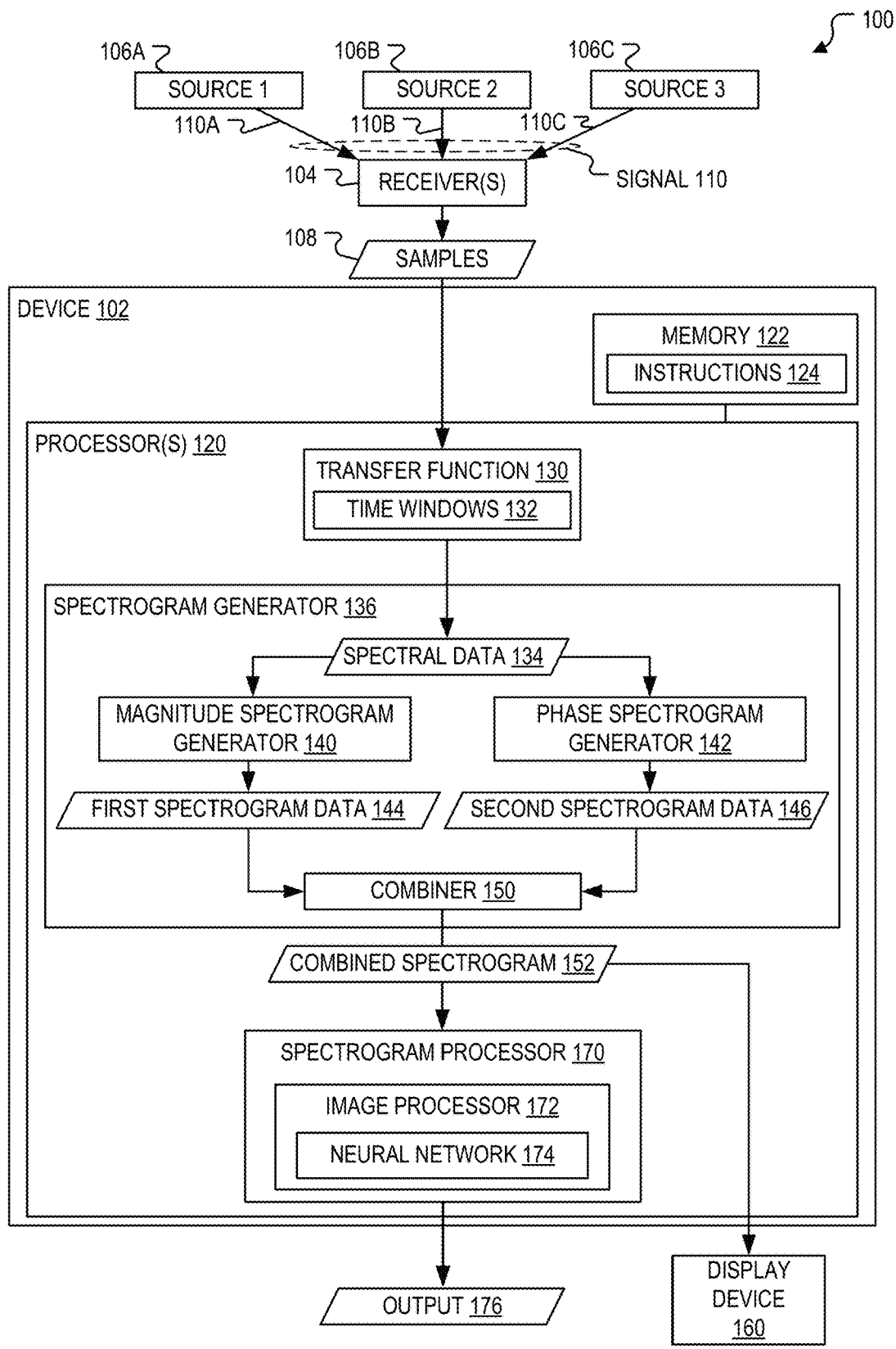
FIG. 1 is a diagram that illustrates a system for signal processing based on combined spectrograms that include magnitude and phase data according to a particular implementation.

Aspects disclosed herein generate combined spectrograms based on a combination of magnitude and phase data for a received signal. Conventional techniques that perform signal processing using a magnitude spectrogram associated with a received signal, such as by performing a STFT on the received signal to generate the spectral information across frequency and over time, rely on magnitude-only spectral data having fixed resolution in both frequency and time, which fundamentally limits performance of such systems due to the loss of phase information and Fourier transform resolution limitations.

The disclosed systems and methods generate combined spectrograms that include both magnitude and phase information. In an example, phase spectrogram data is generated by performing a frequency offset correction to the phase information of the Fourier transform, which removes the dependency of the phase on the bin position of the Fourier transform. Delay differences in the phase information are obtained to determine phase difference data, which can be unwrapped and processed using zero crossing detection. The resulting spectrogram, referred to herein as a phase difference spectrogram or "PDS," can be combined with the magnitude data to produce a combined spectrogram, referred to herein as a "MagZP" spectrogram, which includes both magnitude and phase feature data to enable enhanced signal analysis as compared to conventional techniques that rely on magnitude information only.

According to some aspects, multi-tiered spectrograms are generated using multiple resolution settings for a signal to be processed. In this manner, multiple frequency and time resolutions can be provided to an analysis device, such as an artificial intelligence detector or classifier, allowing the analysis device to discover features across a broader range of time and frequency resolutions than would be available using conventional techniques. For example, spectral information to enable detection of features requiring high time resolution can be extracted, as well as to enable detection of features requiring high frequency resolution. According to some aspects, the multi-tiered spectrograms are formatted as multi-channel image data and processed using image processing techniques including object detection and classification.

The figures and the following description illustrate specific examples. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific examples described below, but by the claims and their equivalents.

Particular implementations are described herein with reference to the drawings. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1, a source 106A, a source 106B, and a source 106C are shown. When referring to a particular one of these sources, such as the source 106A, the distinguishing letter "A" is used. However, when referring to any arbitrary one of these sources or to these sources as a group, the reference number 106 is used without a distinguishing letter. Similarly, this applies to other reference numbers, including: 110, 132, 152, 520, 810, 812, and 814.

As used herein, various terminology is used for the purpose of describing particular implementations only and is not intended to be limiting. For example, the singular forms "a," "an," and "the" are intended to include the plural forms as well, unless the context clearly indicates otherwise. Further, some features described herein are singular in some implementations and plural in other implementations. To illustrate, FIG. 1 depicts a device 102 including one or more processors ("processor(s) 120" in FIG. 1), which indicates that in some implementations the device 102 includes a single processor 120 and in other implementations the device 102 includes multiple processors 120. For ease of reference herein, such features are generally introduced as "one or more" features and are subsequently referred to in the singular unless aspects related to multiple of the features are being described.

The terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating," "calculating," "using," "selecting," "accessing," and "determining" are interchangeable unless context indicates otherwise. For example, "generating," "calculating," or "determining" a parameter (or a signal) can refer to actively generating, calculating, or determining the parameter (or the signal) or can refer to using, selecting, or accessing the parameter (or signal) that is already generated, such as by another component or device. As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

FIG. 1 is a diagram that illustrates a system 100 that includes multiple emitting sources 106 and a device 102 that is coupled to one or more receivers 104 and to a display device 160. The device 102 is configured to receive, from the receiver 104, samples 108 of received emissions and to perform signal processing of the samples 108 based on generating a combined spectrogram 152 that includes magnitude and phase information.

The receiver 104 is configured to receive a signal 110, such as electromagnetic signals that are transmitted from the sources 106 and that are received at the receiver 104 via one more antennas. For example, the receiver 104 receives a first signal 110A transmitted from a first source 106A, such as an aircraft, a second signal transmitted from a second source 106B, such as a portable communication device, and a third signal 110C transmitted from a third source 106C, such as a stationary transmitter. The receiver 104 receives the combined signals 110A, 110B, and 110C as the signal 110 and generates a time series of the samples 108 of the signal 110.

The device 102 is configured to receive and process the samples 108. In an illustrative example, the receiver 104 is coupled to the device 102 and provides the samples 108 to the device 102 in real-time, or near-real-time, via one or more wireless networks, one or more wireline networks, or a combination thereof. In another illustrative example, the receiver 104 is integrated in the device 102. In another illustrative example, the samples 108 are stored in a storage device for later processing by the device 102.

The device 102 includes a memory 122 coupled to one or more processors 120. The memory 122 is configured to store instructions 124 that are executable by the processor 120 to perform operations associated with generating a combined spectrogram 152 based on the samples 108 of the signal 110, as described further below.

The processor 120 is configured to process the samples 108 using a time-windowed transform function 130 to generate spectral data 134 corresponding to each time window 132. In an illustrative, non-limiting example, the transform function 130 corresponds to a short-time Fourier transform (STFT) that is configured to divide the time series of the samples 108 into shorter segments of equal length, corresponding to the time windows 132, and to compute a Fourier transform separately on each segment. In some implementations the segments are overlapping, and in other implementations the segments are non-overlapping. The spectral data 134 includes phase and magnitude information as functions of time and frequency that is input to a spectrogram generator 136. As used herein, "spectral data" refers to a spectrum (e.g., frequency data) that corresponds to a time window of a signal, and can also refer to sequence of spectra that correspond to a sequence of successive time intervals. Spectral data can be represented via complex numbers having real and imaginary components from which phase and magnitude information can be extracted. As used herein, "spectrogram data" refers to data that is physically or logically arranged according to frequency in one dimension and time in a second dimension and includes a numerical value for each (time, frequency) bin to facilitate visual display as a spectrogram. In some implementations, the transform function 130 is configured to use a single time window size to generate the spectral data 134. In other implementations, the transform function 130 is configured to process the samples 108 using multiple sizes of time windows 132, such as described further with reference to FIG. 5.

The processor 120 includes the spectrogram generator 136 coupled to a spectrogram processor 170. The spectrogram generator 136 is configured to generate a combined spectrogram 152 that includes magnitude information and phase difference information corresponding to the samples 108. The spectrogram processor 170 is configured to process the combined spectrogram 152 to detect signal aspects, such as signatures and preambles; to identify one or more signal types associated with the signal 110; to identify one or more emitters associated with the signal 110, or a combination thereof, as illustrative, non-limiting examples.

The spectrogram generator 136 includes a magnitude spectrogram generator 140, a phase spectrogram generator 142, and a combiner 150. The magnitude spectrogram generator 140 is configured to generate first spectrogram data 144 based on magnitudes of the spectral data 134. An example of a spectrogram representing the first spectrogram data 144 is described further with reference to FIG. 2. The phase spectrogram generator 142 is configured to generate second spectrogram data 146 based on phase differences of the spectral data 134. An example of a spectrogram representing the second spectrogram data 146 is described further with reference to FIG. 2. In some implementations, generating the second spectrogram data 146 includes performing phase differencing, unwrapping, and rectifying operations to phase information in the spectral data 134, such as described further with reference to FIG. 3.

The combiner 150 is configured to combine the first spectrogram data 144 and the second spectrogram data 146 to generate a combined spectrogram 152. An example of a combined spectrogram 152 is described further with reference to FIG. 2. In a particular implementation, the combiner 150 is configured to multiply values of the first spectrogram data 144 and values of the second spectrogram data 146 to generate the combined spectrogram 152. In a particular example, the combined spectrogram 152 provides a high-fidelity image of signal information.

In some implementations, the processor 120 is configured to send the combined spectrogram 152 to the display device 160 for visual display. In a particular example, a user or operator of the device 102 (e.g., a signals expert) can view the combined spectrogram 152 at the display device 160 to detect or identify various emitters (e.g., the emitting sources 106A, 106B, and 106C) or signal types based on features in the combined spectrogram 152.

Alternatively, or in addition, the combined spectrogram is processed at the spectrogram processor 170 to generate an output 176. The spectrogram processor 170 includes a neural network 174 that is accessible to an image processor 172 and that is configured to process image data. In some implementations, the image processor 172 is configured to process multi-channel data using the neural network 174, such as a convolutional neural network (CNN) trained to identify features in the received multi-channel data.

For example, in some implementations, the processor 120 is configured to generate multiple combined spectrograms, including the combined spectrogram 152, for the signal 110 using different time window sizes of the transform function 130. To illustrate, a smaller time window provides higher frequency resolution as compared to a larger time window, and the larger time window provides higher time resolution as compared to the smaller time window. By generating multiple combined spectrograms based on the same samples 108 using different sized time windows, a wider range of features can be detected as compared to using a single combined spectrogram 152. The processor 120 is configured to format the multiple combined spectrograms as multi-channel image data for processing at the image processor 172, such as described further with reference to FIG. 5.

In some implementations, the spectrogram processor 170 is configured to input the combined spectrogram 152 into the neural network 174 to process image data. By including phase difference and magnitude information, the combined spectrogram 152 enables detection, by the neural network 174, of one or more waveform signatures, such as described further with reference to FIG. 8, and enables preamble detection and identification of a particular waveform instance based on the one or more waveform signatures, such as described further with reference to FIG. 9. In some implementations, the combined spectrogram 152 enables detection, by the neural network 174, of the presence of the multiple emitting sources 106A, 106B, and 106C. In a particular example, the processor 120 is configured to identify specific emitting sources of the multiple emitting sources 106A, 106B, and 106C based on detecting characteristics unique to the specific emitting sources 106A, 106B, and 106C. In some implementations, information indicating identified waveform signatures, waveform instances, and emitting sources are included in the output 176. The output 176 can correspond to a data file or stream that is configured to be stored, communicated to another device, processed by another component of an emitter tracking system, or a combination thereof.

By generating the combined spectrogram 152 including magnitude and phase difference information, the device 102 enables enhanced detection of features in the signal 110 as compared to use of a conventional spectrogram that omits phase difference data. Processing of the combined spectrogram 152 at the spectrogram processor 170 enables preamble detection, waveform identification, emitter identification, or a combination thereof, to be provided via the output 176. Additional resolution and detection capability is provided in implementations in which multiple combined spectrograms corresponding to a set of samples are generated using different time window sizes at the transform function 130 and processed as multi-channel image data at the image processor 172.

Although in some implementations the transform function 130, the spectrogram generator 136, the magnitude spectrogram generator 140, the phase spectrogram generator 142, the combiner 150, the spectrogram processor 170, the image processor 172, and the neural network 174 are implemented via the processor 120 executing the instructions 124, in other implementations one or more (or all) of the transform function 130, the spectrogram generator 136, the magnitude spectrogram generator 140, the phase spectrogram generator 142, the combiner 150, the spectrogram processor 170, the image processor 172, and the neural network 174 are at least partially implemented via dedicated components (e.g., hardware, circuitry) configured to perform the recited operations. In an illustrative, non-limiting example, the processor 120 includes dedicated STFT circuitry to implement the transform function 130, dedicated absolute value circuitry to implement the magnitude spectrogram generator 140, dedicated phase processing circuitry to implement the phase spectrogram generator 142, and a multiplier circuit to implement the combiner 150.

Figure 2:
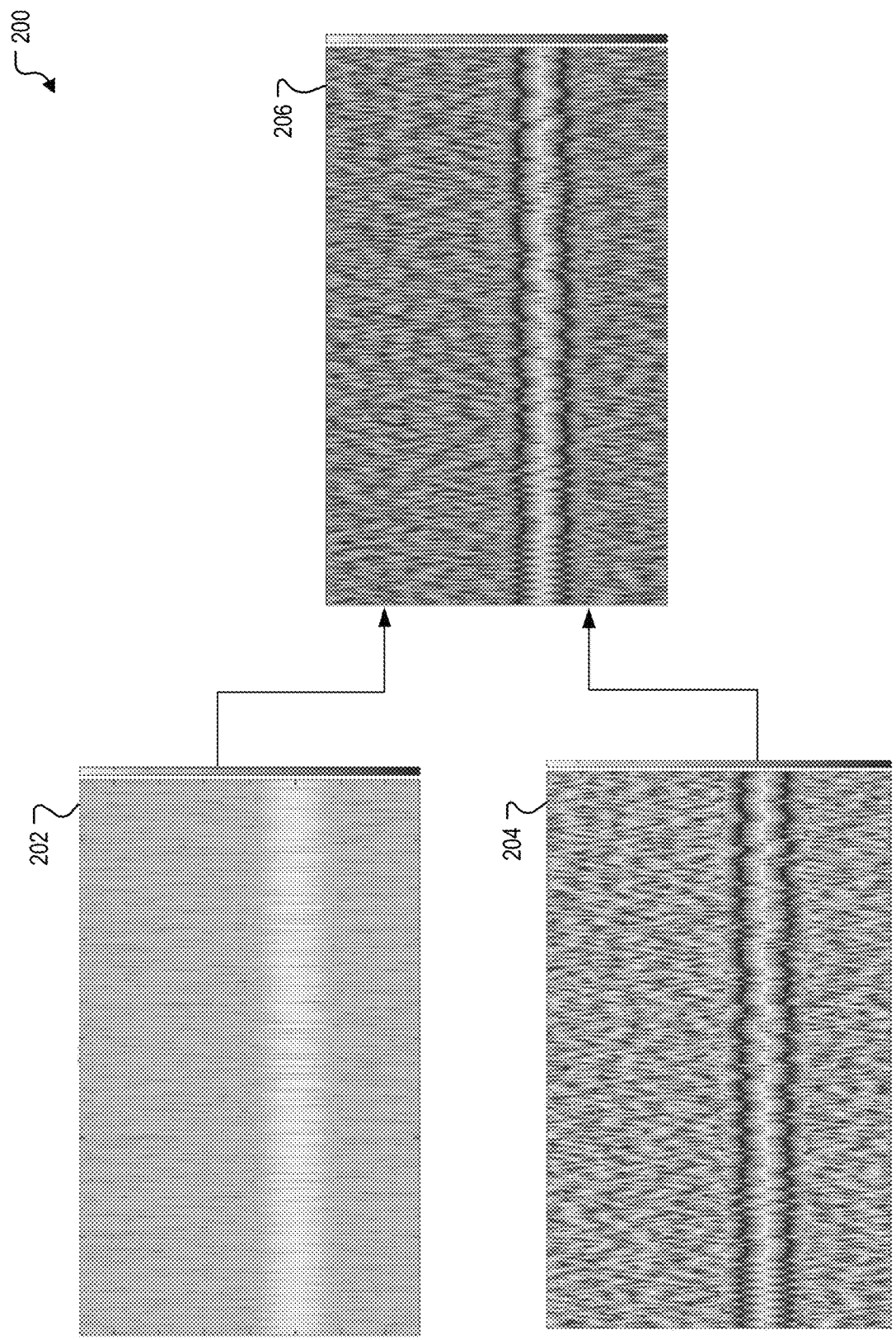
FIG. 2 is a diagram that illustrates an example of generation of a combined spectrogram by the device of FIG. 1 according to a particular implementation.

FIG. 2 is a diagram that illustrates an example 200 that graphically depicts a first spectrogram 202 and a second spectrogram 204 that are combined by the device of FIG. 1 to generate a combined spectrogram 206, according to a particular implementation.

The first spectrogram 202 of FIG. 2 represents a magnitude-only spectrogram corresponding to the first spectrogram data 144 for a modulated signal, such as a 50 kilohertz (kHz) quadrature phase shift keying (QPSK) modulated signal, received from a single source (e.g., transmitted by the first source 106A), as an illustrative, non-limiting example. The second spectrogram 204 of FIG. 2 represents a phase difference spectrogram (PDS) corresponding to the second spectrogram data 146 for the modulated signal.

The second spectrogram 204 is generated based on processing the spectral data 134. Generation of the second spectrogram 204 can include determining phase data from the spectral data 134, using a frequency offset correction pattern to individually convert each frequency bin of the phase data to baseband, and performing phase differencing relative to resolution of the phase data to generate phase difference data. Generation of the second spectrogram 204 can also include "unwrapping" the phase difference data to resolve phase ambiguity, and performing magnitude extraction and phase reversal, such as described further with reference to FIG. 3 and FIG. 4. As compared to the magnitude spectrogram 202, the PDS spectrogram 204 provides improved effective frequency resolution, greater symbol visibility, and improved noise sensitivity.

The first spectrogram 202 and the second spectrogram 204 are mixed (e.g., multiplied) to generate a combined spectrogram (MagZP) 206 that corresponds to the combined spectrogram 152. Because the combined spectrogram 206 incorporates data from both the first spectrogram 202 and the second spectrogram 204, the combined spectrogram 206 includes additional information for enhanced detection and classification of signals as compared to use of the first spectrogram 202 only.

Figure 3:
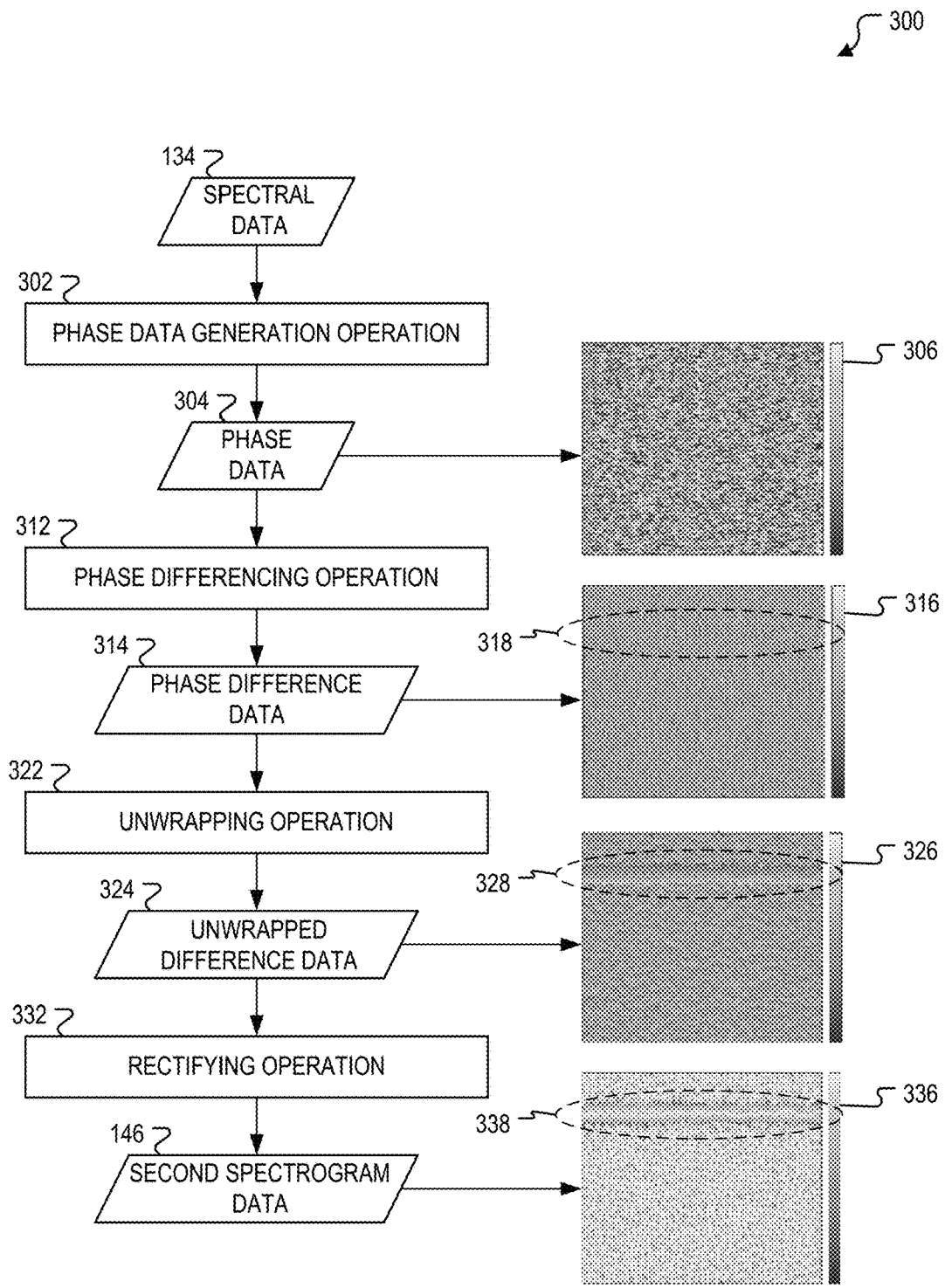
FIG. 3 is a diagram that illustrates an example of a flow diagram showing processing stages and corresponding phase data to generate the phase spectrogram data of FIG. 1 according to a particular implementation.

FIG. 3 is a diagram that illustrates an example of a flow diagram 300 showing processing stages, and graphical examples of phase data associated with each of the processing stages, to generate the second spectrogram data 146 of FIG. 1, according to a particular implementation.

In an illustrative example, the spectral data 134 is generated by the transform function 130 of FIG. 1 as the output of a short-time Fourier transform:

$$\text{STFT} = F(x_n)_f = X[f,n] = \sum_{k=n}^{n+N-1} x[k] b[k-n] e^{-j2\pi/Nfk} \text{ for } n=0, s, 2s, \ldots, M-1-N$$

where f indicates a frequency index, n represents a time index, x represents a signal (e.g., a time series of the samples 108) of length M, x[k] represents a value of x at time index k, b is a shaping function (e.g., a shaping window), j represents the square root of −1, s represents a stride, and N represents a length of the segments of x upon which the discrete Fourier transform is applied. Note that b[k] can include a shaping window, such as a Hann window that is padded by zeros to interpolate by a factor Z, where the true window size W=N/Z, and where b[k]=[Hann(W) zeros(N−W)].

The processor 120 (e.g., the phase spectrogram generator 142) performs a phase data generation operation 302 on the spectral data 134. The phase data generation operation 302 generates, from the spectral data 134, phase data 304 that is corrected for phase rotation due to frequency offset from baseband.

To illustrate, the STFT provides phase information as:

Phase=θ[k]=a tan 2(imag(X[f,n]),real(X[f,n]))

where a tan 2(x, y) is a function that returns the angle between the positive x axis and a ray that extends from (0,0) to (x, y), confined to (−π, π] (i.e., the range from −π to π, including π and excluding −π), real(X[f,n]) is a function that returns the real portion of X[f,n], and imag(X[f,n]) is a function that returns the imaginary portion of X[f,n].

A standard discrete Fourier transform (DFT) bin has a phase rotation due to the bin's frequency offset from baseband. In order to remove this phase rotation, each DFT is multiplied with a complex exponential corresponding to the corresponding frequency offset and start time. The time component is matched with the time corresponding to the stride of the Fourier transform. When aligned correctly, the frequency rotation (phase delta) from the bin position is removed. In some implementations, removal of the frequency rotation corresponds to a specific utilization of the generalized DFT (GDFT), also known as the shifted DFT or offset DFT using the Shift Theorem. The phase corrected STFT (PCSTFT) is as follows:

$$PCSTFT = \tilde{F}(x_n)_f = \tilde{X}[f,n] = X[f,n]e^{-j\frac{2\pi}{N}fn} = \sum_{k=n}^{n+N-1} x[k]b[k-n]e^{-j\frac{2\pi}{N}f(k+n)}$$

and the corrected phase information (Pcorrected) is given by:

Pcorrected=a tan 2(imag($\tilde{X}$),real($\tilde{X}$)).

Performing an a tan 2 operation on the PCSTFT results in the phase data 304 that is corrected for phase rotation due to frequency offset from baseband, expressed as:

$$P = -j\ln\frac{\tilde{X}[f,n]}{|\tilde{X}[f,n]|} = \arg(\tilde{X}[f,n]).$$

Another method to correct the phase is to perform the correction on the phase output of the DFT, illustrated as a sequence of pseudocode operations:

P=a tan 2(imag(X),real(X))

dPhi=(1−(Tres.*−f))*2π

Pdiff=mod(dPhi*(0:length(P)−1),2π)−π

Pcorrected=mod(P−Pdiff,2π)−π where P represents phase data, dPhi represents a frequency rotation, Tres represents a time resolution, ".*" represents an elementwise multiplication operation, f represents frequency data, Pdiff represents offset data (e.g., a frequency offset correction pattern), and mod represents a modulus after division operation.

Correcting for phase rotation due to frequency offset from baseband has no effect on the magnitude output but creates a frequency agnostic signal shifted pattern in phase. In some examples, the window size W can be selected to provide interpolated resolution Z of at least 4 times the true bin resolution, where W=N/Z. However, larger interpolations rates, such as 64 and 128, can produce improved results.

An illustrative example of the phase data 304 is graphically illustrated as a spectrogram 306. For all spectrograms illustrated herein, unless expressly indicated otherwise, time increases from left to right along the horizontal axis, frequency increases from bottom to top along the vertical axis, and a value at each time, frequency pair is represented by the relative brightness of the spectrogram at that time and frequency, within a range as indicated in the vertical bar on the right side of the spectrogram.

The processor 120 (e.g., the phase spectrogram generator 142) performs a phase differencing operation 312 to generate phase difference data 314 based on the phase data 304. The phase differencing operation computes the slope of the phase change in the frequency bins, which can be considered the equivalent of differencing the phase of a shifting window across [f,n] space. Because the data is phase aligned, the differencing results in the overlap being cancelled out. The resulting phase information is composed of the non-overlap region of arg($\tilde{X}$[f, n]) and a negated non-overlap region of arg($\tilde{X}$[f, n+Ds]). The phase difference data 314 can be expressed as:

Pdiff=arg($\tilde{X}$[f,n])−arg($\tilde{X}$[f,n+Ds]).

The selected delay D can be selected as function of the time overlap T=window size W/stride s. This defines the slope of the differenced phase over frequency across the signal. A time overlap divided by 4 provides a nominal single rotation across the 3 decibel (dB) points of most signals D=(N/s)/4. However in cases with low signal-to-noise ratios (SNR), division by 8 can provide enhanced results when N/W is less than or equal to 16.

An illustrative example of the phase difference data 314 is graphically illustrated as a spectrogram 316 that includes a feature 318 corresponding to phase differences indicative of a modulated signal.

The processor 120 (e.g., the phase spectrogram generator 142) performs an unwrapping operation 322 of the phase difference data 314 to generate unwrapped difference data 324. To illustrate, the phase differencing can result in some values that are outside the interval [−π,π], which are corrected by adding or subtracting 2π. By taking the absolute value of the corrected difference, the resulting phase information is the non-overlapped regions of the new and old information. An illustrative example of the unwrapped difference data 324 is graphically illustrated as a spectrogram 326 that includes a feature 328 corresponding to the modulated signal shown by the feature 318 of the phase difference data 314.

The processor 120 (e.g., the phase spectrogram generator 142) performs a rectifying operation 332 to rectify the unwrapped difference data 324 to generate the second spectrogram data 146. An illustrative example of the second spectrogram data 146 is graphically illustrated as a spectrogram 336 (e.g., a phase difference spectrogram) that includes a feature 338 corresponding to the modulated signal. The zero crossing point of the phase data is the center of the carrier's instantaneous frequency. By rectifying (e.g., absolute value) this output, the zero crossing becomes a peak more clearly showing the carrier information which matches the magnitude spectrogram. The second spectrogram data 146 can be determined as:

Phase difference Spectrogram (PDS)=abs(unwrapped (arg($\tilde{X}$[f,n])−arg($\tilde{X}$[f,n+Ds])))

where abs( ) represents an absolute value function.

In some implementations, enhanced efficiency is obtained by also including the magnitude of $\tilde{X}$[f, n+Ds] in the MagZP product, which enables computation of PCSTFT to be bypassed. The modified MagZP is expressed as MagZP$_{mod}$=|$\tilde{X}$[f,n]|*|$\tilde{X}$[f,n+Ds]|*PDS.

Reduced computational complexity can be understood via consideration of the product Corr[f, n, Ds]=$\tilde{X}$[f, n]*conj($\tilde{X}$[f,n+Ds]). The magnitude of Corr[f,n,Ds] is equal to the product of the first two terms in MagZP$_{mod}$ while the phase of Corr[f,n,Ds] can be used to compute the phase difference spectrogram:

arg(Corr[f,n,Ds])=arg($\tilde{X}$[f,n]*conj($\tilde{X}$[f,n+Ds]))=arg($\tilde{X}$[f,n])−arg($\tilde{X}$[f,n+Ds]).

Corr[f,n,Ds] can be rewritten as:

$$\text{Corr}[f, n, Ds] = \tilde{X}[f, n] * conj(\tilde{X}[f, n + Ds]) =$$

$$X[f, n]e^{-j\frac{2\pi}{N}fn} * conj\left(X[f, n + DS]e^{-j\frac{2\pi}{N}f(n+Ds)}\right) =$$

$$X[f, n] * conj\left(X[f, n + Ds]e^{-j\frac{2\pi}{N}fDs}\right)$$

The term $$X[f, n + Ds]e^{-j\frac{2\pi}{N}fDs}$$

is a STFT of a sequence x[n+Ds] time delayed by Ds. Therefore, Corr[f,n,Ds] represents the Fourier transform of a correlation of sequence x[n] and sequence x[n+Ds] time delayed by Ds samples. In other words, MagZP$_{mod}$ can be determined by computing the STFT of x[n] and time delayed x[n+Ds]:

$$MagZP_{mod} = |\text{Corr}[f, n, Ds]| * \text{abs}(unwrap(\arg(\text{Corr}[f, n, Ds])))$$

where $$\text{Corr}[f, n, Ds] = X[f, n] * conj\left(X[f, n + Ds]e^{-j\frac{2\pi}{N}fDs}\right).$$

Figure 4:
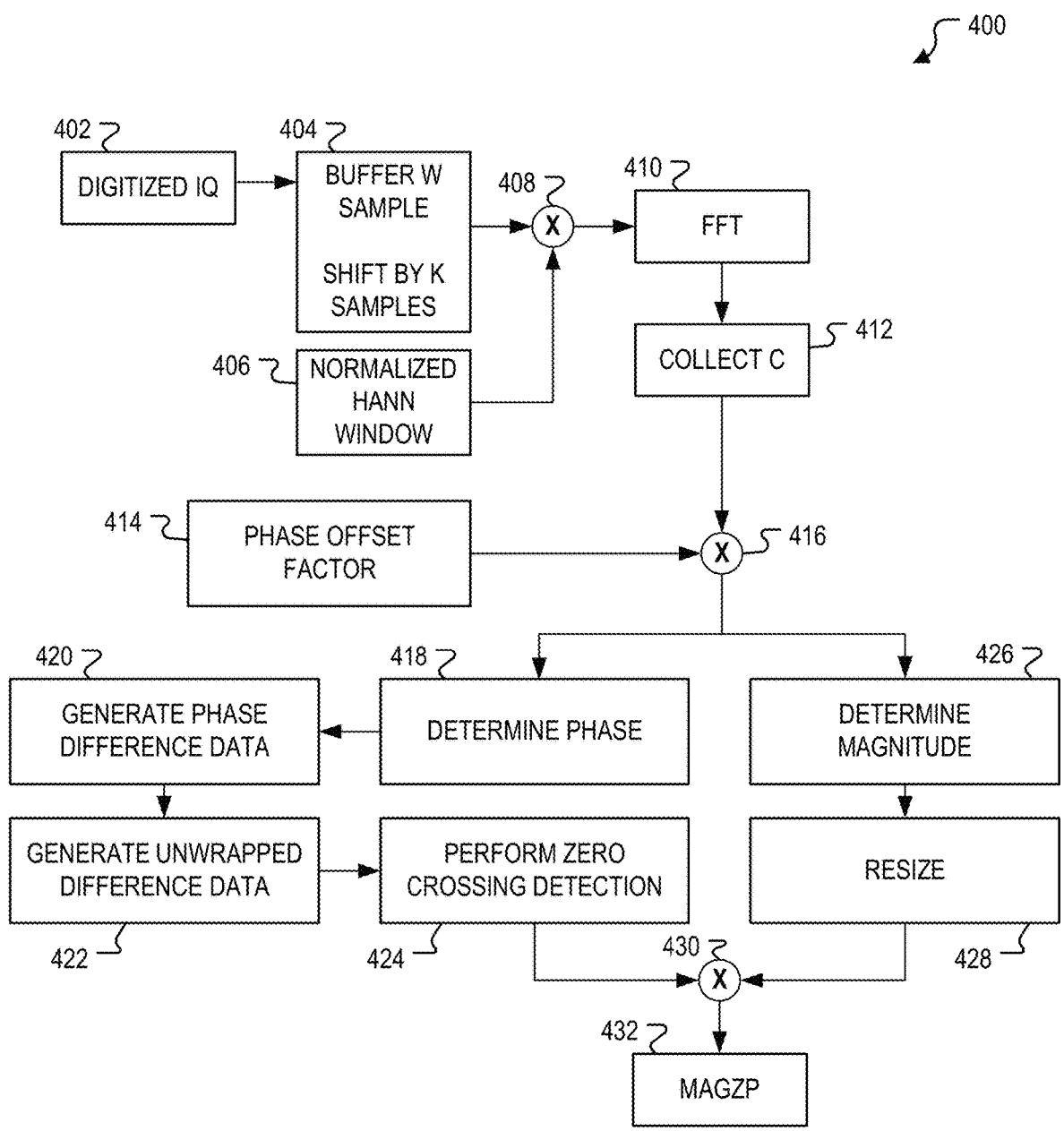
FIG. 4 is a diagram that illustrates an example of operations performed by the device of FIG. 1 according to a particular implementation.

FIG. 4 is a diagram that illustrates an example method 400 that includes operations performed by the device of FIG. 1 according to a particular implementation. At 402, digitized in-phase and quadrature (IQ) data is received, such as the samples 108 received at the processor 120. At 404, W samples of the IQ data are buffered and shifted by K samples. At a 406, data corresponding to a normalized Hann window is provided and, at 408, the shifted samples are multiplied with the normalized Hann window. At 410, the multiplication result is processed at a Fourier transform operation, such as an FFT (e.g., the transform function 130).

At 412, the output C of the Fourier transform operation is collected, and, at 414, a phase offset factor is provided. At 416, the output C is multiplied by the phase offset factor to generate a phase corrected output. For example, the product of the output C and the phase offset factor can correspond to a phase corrected STFT and expressed as:

$$\tilde{X}[f, n] = X[f, n]e^{-j\frac{2\pi}{N}fn}$$

where X[f,n] corresponds to the output C, $$e^{-j\frac{2\pi}{N}fn}$$

corresponds to the phase offset factor, f indicates a frequency index, n represents a time index, j represents the square root of −1, and N represents a length of the segments upon which the Fourier transform is applied.

At 418, the phase Pcorrected of the phase corrected output is computed, such as:

Pcorrected=arg($\tilde{X}$[f,n])=a tan 2(imag($\tilde{X}$),real($\tilde{X}$)).

At 420, phase difference data is generated, such as described with reference to the phase differencing operation 312 of FIG. 3. For example, the phase difference data Pdiff can be expressed as:

Pdiff=arg($\tilde{X}$[f,n])−arg($\tilde{X}$[f,n+Ds])

where D indicates delay and s indicates stride.

At 422, an unwrapping operation is performed to generate unwrapped difference data, such as described with reference to the unwrapping operation 322 of FIG. 3. For example, the unwrapped difference data Punwrapped can be determined based on values of the phase difference data Pdiff according to:

Punwrapped=Pdiff, if |Pdiff|≤π

Punwrapped=Pdiff−2π, if Pdiff>π

Punwrapped=Pdiff+2π, if Pdiff<−π.

At 424, a zero crossing detection operation is performed, such as described with reference to the rectifying operation 332 of FIG. 3. For example, the zero crossing detection operation may generate an output corresponding to 2π−|Punwrapped|.

At 426, magnitude data of the phase corrected output is computed. For example, the magnitude of the phase corrected STFT can be expressed as |$\tilde{X}$[f, n]|.

At 428, a resizing operation can be performed on the magnitude data for multiplication with the output of the zero crossing detection operation. The output of the zero crossing detection operation (e.g., the second spectrogram data 146) and the output of the resizing operation (e.g., the first spectrogram data 144) are multiplied, at 430, to generate a MagZP spectrogram (e.g., the combined spectrogram 152), at 432.

Figure 5:
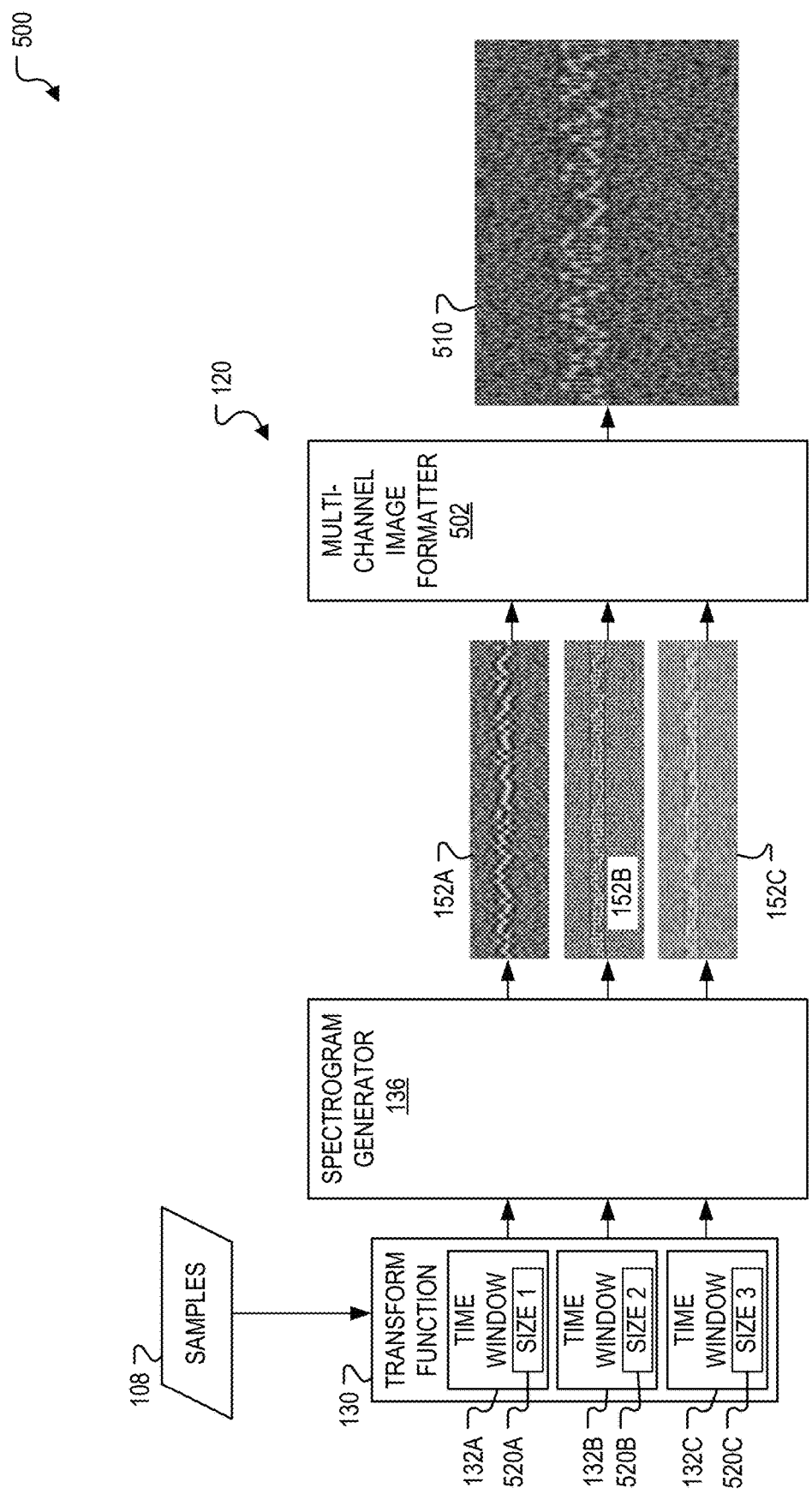
FIG. 5 is a diagram that illustrates an example of generating, by the device of FIG. 1, multiple combined spectrograms using different time windows and formatting the multiple combined spectrograms as multi-channel image data according to a particular implementation.

FIG. 5 is a diagram that illustrates an example 500 of components of the processor 120 according to a particular implementation in which the processor 120 is configured to generate multiple combined spectrograms using different time windows and to format the multiple combined spectrograms as multi-channel image data according to a particular implementation. With a single fixed resolution MagZP image, image processing (e.g., artificial intelligence-based image processing) is limited by the selected time and frequency resolution, which can be sub-optimal for different kinds of spectral inputs. A multi-channel approach can be used to provide different resolutions that provide different balances between frequency resolution and time resolution. The different channels can be used to represent different resolutions using a conventional image format, such as RGB (having Red, Green, and Blue channels) or RGBA (having Red, Green, Blue, and Alpha channels) as illustrative, non-limiting examples. In an example implementation using an RGB image, the Red channel is used for fine time and coarse frequency resolution, the Green channel is used for medium time resolution and medium frequency resolution, and the Blue channel is used for fine frequency resolution and coarse time resolution. The bin sizes can be selected to span expected input signal spectral characteristics.

In some implementations, bin sizes are selected such that that all of the RGB channel bins have the same observation time and frequency. To illustrate, a bin from the R channel represents the same time and frequency block as the corresponding bins from the G and B channels despite having different resolutions. This can be accomplished by zero pad interpolation in the frequency domain and overlapped shifts in the time domain.

As illustrated, the samples 108 are received at the transform function 130 of the processor 120. The transform function 130 is configured to process the samples 108 to generate first spectral data using a first time window 132A having a first size 520A, second spectral data using a second time window 132B having a second size 520B, and a third time window 132C having a third size 520C. The three sets of spectral data are each processed by the spectrogram generator 136 to generate a first combined spectrogram 152A, a second combined spectrogram 152B, and a third combined spectrogram 152C for the signal 110 (e.g., a frequency-shift keying (FSK) modulated signal) that use the different time window sizes of the transform function 130. For example, the first combined spectrogram 152A is generated using the first time window size 520A, the second combined spectrogram 152B is generated using the second time window size 520B, and the third combined spectrogram 152C is generated using the third time window size 520C. The first combined spectrogram 152A has relatively coarse (e.g., low) frequency resolution and relatively fine (e.g., high) time resolution. The second combined spectrogram 152B has medium frequency resolution and relatively fine time resolution. The third combined spectrogram 152C has relatively fine frequency resolution and relatively coarse time resolution.

A multi-channel image formatter 502 (e.g., a component of the spectrogram generator 136 or distinct from the spectrogram generator 136) is configured to format the multiple combined spectrograms 152A, 152B, and 152C as multi-channel image data 510 for processing at the image processor 172. In a particular example, each particular bin of one channel of the multi-channel image data 510 corresponds to a same time and frequency block as the corresponding bins of the other channels of the multi-channel image data 510.

To illustrate, the neural network 174 of the image processor 172 can correspond to one or more deep convolutional neural networks, and the multi-channel image data 510 (e.g., formatted as an RGB image) provides a greater number of significant features for training the neural network 174 as compared to using a single combined spectrogram.

Time window sizes for the transform function can be selected as appropriate, such as based on the applicable hardware, sampling rate, and target time and frequency resolutions. To illustrate, for X resolutions (e.g., X channels), spectral data can be generated using a sampling frequency Fs and a sampling time Ts=1/Fs. Appropriate values of an FFT size (e.g. time window size) N and a stare time C can be selected as based on a particular application. A stride "s" can be selected having a value greater than two, and a window size W can be selected such that N>=W*2 (where ">=" indicates "greater than or equal to"). In some implementations, enhanced results are obtained when N>=W*4. A time overlap T=W/s, and a zero pad multiplier Z can be selected such that N=W*Z. A delta D can be selected as D=T/4 when D>=1. In some implementations in which N/W<=16, enhanced results are obtained when D=T/8. Frequency and time bin resolutions can be equivalent for all X channels, such as time resolution=Ts*(W/T) and frequency resolution=Fs/(W*Z)

In an example configuration, a first channel has N=1024, s=4, W=8, T=2, Z=128, and D=1. A second channel has N=1024, s=4, W=16, T=4, Z=64, and D=2, and a third channel has N=1024, s=4, W=64, T=16, Z=16, and D=4.

Multi-channel image data, such as described with reference to FIG. 5, can be used for artificial intelligence-based radiofrequency (RF) detection and classification. For example, deep learning image recognition can be used for applications such as signals intelligence (SIGINT), communications intelligence (COMINT), and spectrum analysis. Applications can include providing reports of new observed signals in wideband RF, recognition of modulation types, and identification of specific signals of interest, as illustrative, non-limiting examples.

Multiple architectures can be implemented based on the use case. For example, detection use cases can include 'object detection' network architectures, such as Faster-RCNN, as an illustrative example. Classification use cases can include deep convolutional neural networks (DCNN), such as EfficientNet, as an illustrative example. Each network type can be replaced and improved to utilize the latest advancements in CNN classification and detection architectures. Such implementations can benefit from use of an advanced spectral feature extractor, such as described with reference to FIGS. 1-5, to produce information used for inference and training.

Figure 6:
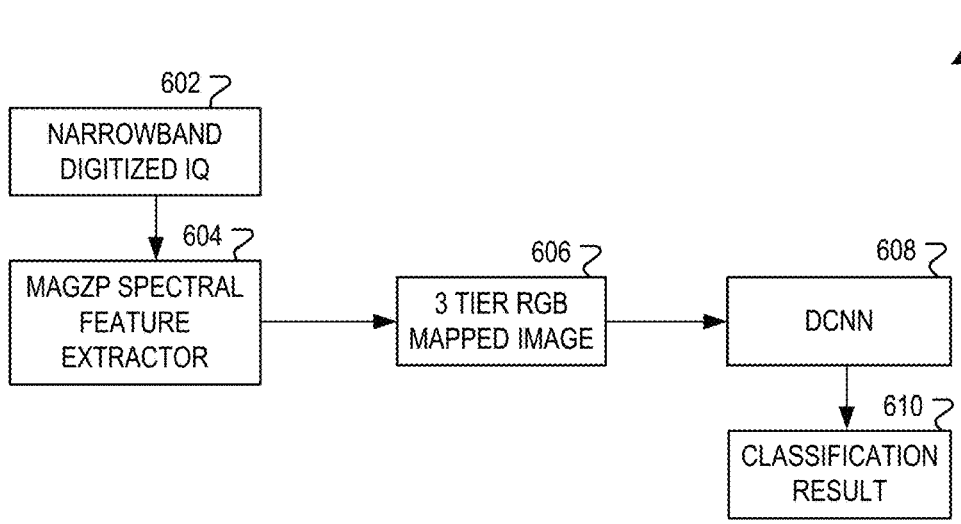
FIG. 6 is a diagram that illustrates an example of operations performed by the device of FIG. 1 according to a particular implementation.

FIG. 6 is a diagram that illustrates an example 600 of operations performed by the device of FIG. 1, according to a particular implementation, that generates a classification result. A narrowband digitized IQ signal 602 is received at a MagZP spectral feature extractor 604, such as the device 102 or the processor 120 of FIG. 5, as illustrative, non-limiting examples. The MagZP spectral feature extractor 604 generates a three-tier RGB mapped image 606. For example, the three-tier RGB mapped image 606 can correspond to the multi-channel image data 510 of FIG. 5, with each "tier" corresponding to a different configuration of time and frequency resolutions that is mapped to a color channel of the mapped image. The three-tier RGB mapped image 606 is processed by a DCNN 608 (such as Faster-RCNN or EfficientDet, as non-limiting examples) to generate a classification result 610. In some implementations, the DCNN 608 corresponds to the spectrogram processor 170, the image processor 172, the neural network 174, or a combination thereof.

Figure 7:
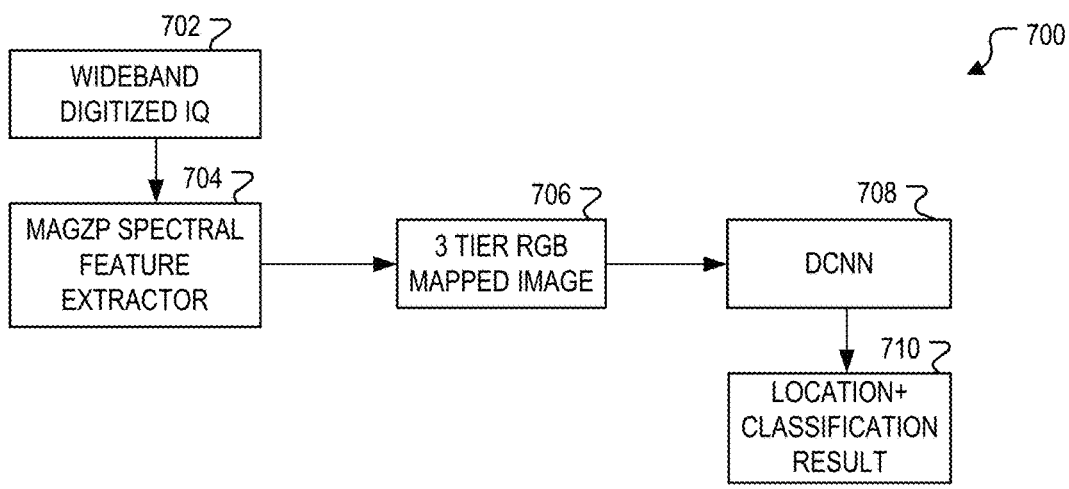
FIG. 7 is a diagram that illustrates an example of operations performed by the device of FIG. 1 according to a particular implementation.

FIG. 7 is a diagram that illustrates an example 700 of operations performed by the device of FIG. 1, according to a particular implementation, that generates a location and classification result. A wideband digitized IQ signal 702 is received at a MagZP spectral feature extractor 704, such as the device 102 or the processor 120 of FIG. 5, as illustrative, non-limiting examples. The MagZP spectral feature extractor 704 generates a three-tier RGB mapped image 706. For example, the three-tier RGB mapped image 706 can correspond to the multi-channel image data 510 of FIG. 5, with each "tier" corresponding to a different configuration of time and frequency resolutions that is mapped to a color channel of the mapped image. The three-tier RGB mapped image 706 is processed by a DCNN 708 (such as Faster-RCNN or EfficientDet, as non-limiting examples) to generate a location and classification result 710. In some implementations, the DCNN 708 corresponds to the spectrogram processor 170, the image processor 172, the neural network 174, or a combination thereof.

Neural networks, and in particular convolutional neural networks, can be used to perform signal classification for communication signals recognition (classification). For example, a baseband signal can be processed with a MagZP spectrogram to extract RF features. Such a network can be implemented to perform real-time or near real-time communication system identification using spectral and temporal content, and can operate in a manner similar to a signal-specific two-dimensional matched filter. Such systems can be updated based on using flexible training input, such as captured content, to generate a classifier.

Image-based classification can be employed by the device 102 of FIG. 1 and can include classifying modulation spectral features, such as bandwidth, roll off, symbol data, filter ramps, and on/off effects, as illustrative, non-limiting examples. Image-based classification using MagZP spectrograms enables operation as an artificial intelligence-based one-shot baseband signal recognizer to classify a specific communication system type. In some implementations, a user can perform guided transfer learning using a single capture by synthetic data augmentation, enabling fast training of a network for specific signal search and identification. Relatively high classification accuracy can be attained, such as 97.5% accuracy using a 12-bit barker code preamble as a feature, in an illustrative, non-limiting example.

Figure 8:
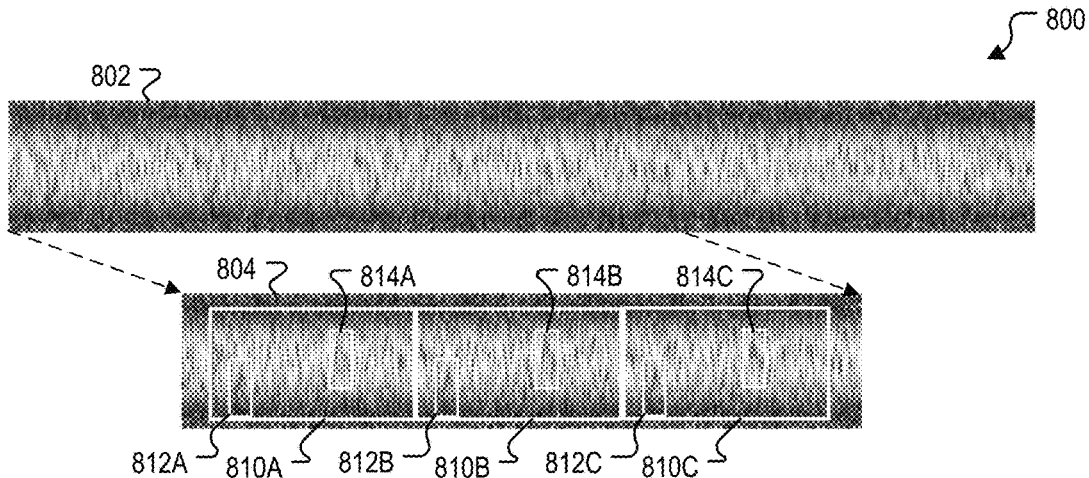
FIG. 8 is a diagram that illustrates an example of waveform signature and preamble detection results generated by the device of FIG. 1 according to a particular implementation.

FIG. 8 is a diagram that illustrates an example 800 of waveform signature and preamble detection results generated by the device of FIG. 1 according to a particular implementation. A first MagZP spectrogram 802 represents a received signal, and a second MagZP spectrogram 804 represents a portion of the first MagZP spectrogram 802 that includes a repeated preamble portion of the received signal, including a first instance 810A, a second instance 810B, and a third instance 810C of the preamble portion. In some implementations, the first MagZP spectrogram 802, the second MagZP spectrogram 804, or both, correspond to the combined spectrogram 152 of FIG. 1, the multi-channel image data 510 of FIG. 5, the three tier RGB mapped image 606 of FIG. 6, or the three tier RGB mapped image 706 of FIG. 7, as illustrative, non-limiting examples.

Use of the magnitude and phase information in the MagZP spectrogram enables detection, such as by the neural network 174 of FIG. 1, of one or more waveform signatures. A first waveform signature 812 and a second waveform signature 814 are illustrated in the preamble instances 810A, 810B, and 810C as instances 812A, 812B, and 812C of the first waveform signature 812 and instances 814A, 814B, and 814C of the second waveform signature 814, respectively. Each of the first waveform signature 812 and the second waveform signature 814 corresponds to or includes features that are detectable by a trained network and that are useful in detecting a signal and classifying a type of the signal. In a particular example, detection of one or more waveform signatures 812 and 814 includes preamble detection. To illustrate, the neural network 174 can be trained to classify a portion of a signal in which the first waveform signature 812 and the second waveform signature 814 are detected as a preamble of a particular signal type (e.g., a FSK modulated signal).

The combined spectrogram 152 enables identification, by the neural network 174, of a particular waveform instance based on the one or more waveform signatures, such as described with reference to FIG. 9 and FIG. 10.

Figure 9:
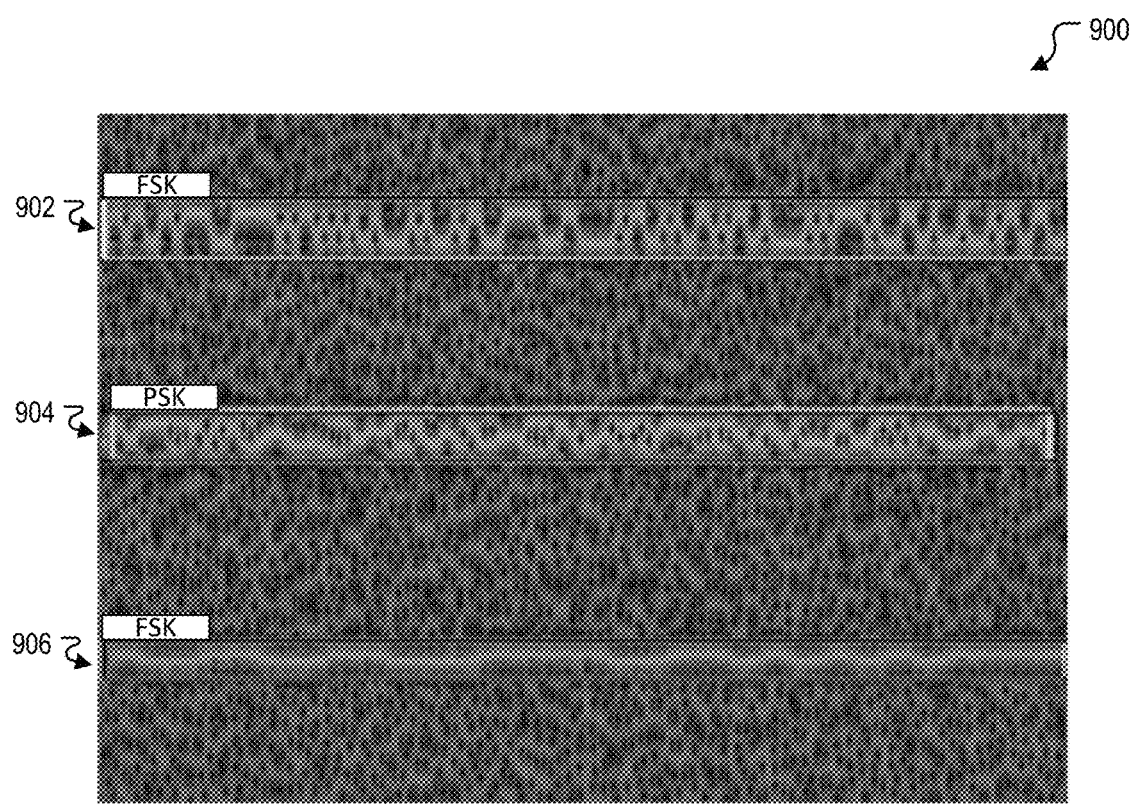
FIG. 9 is a diagram that illustrates an example of a combined spectrogram including multiple waveform detection results generated by the device of FIG. 1 according to a particular implementation.
Figure 10:
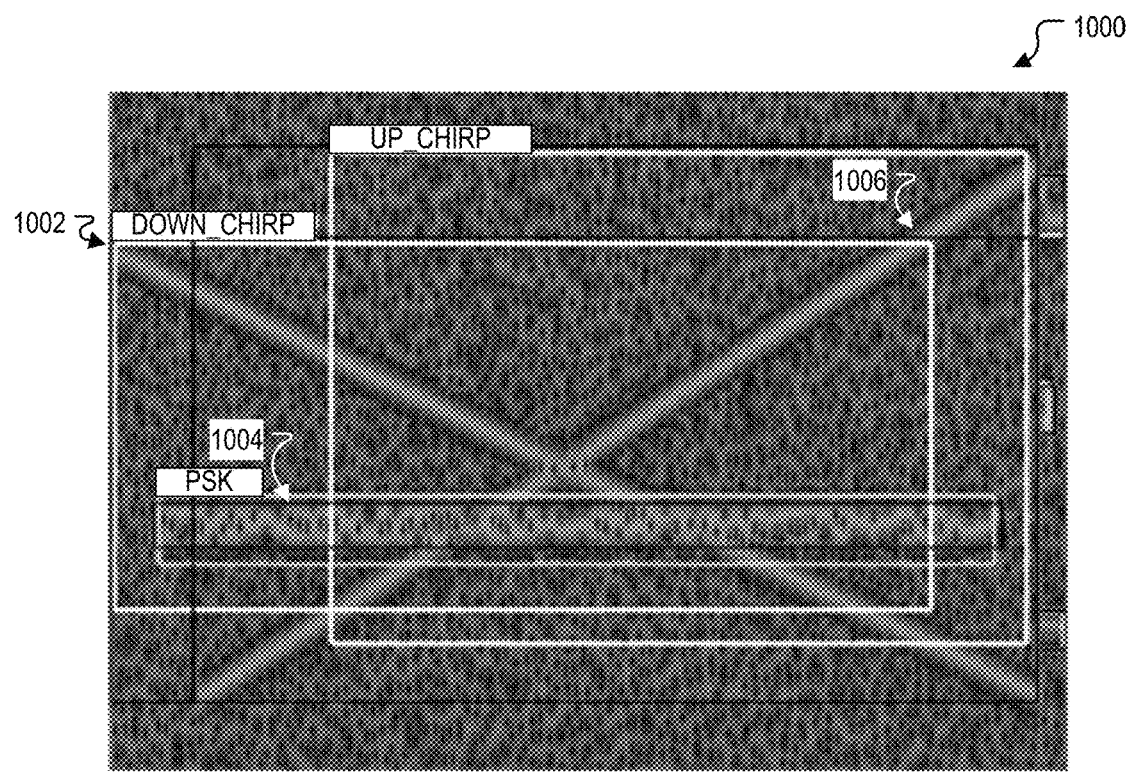
FIG. 10 is a diagram that illustrates another example of a combined spectrogram including multiple waveform detection results generated by the device of FIG. 1 according to a particular implementation.

FIG. 9 is a diagram 900 that illustrates an example of the combined spectrogram 152 overlaid with multiple waveform detection results (e.g., labels and bounding boxes), such as generated by the device of FIG. 1 as the output 176, displayed at the display device 160, or a combination thereof. The combined spectrogram 152 enables identification, by the neural network 174, of a particular waveform instance based on one or more waveform signatures. In a multi-signal environment, such as when the receiver 104 receives the first signal 110A as a first FSK modulated signal, the second signal 110B as a PSK modulated signal, and the third signal 110C as a second FSK modulated signal, the device 102 can separate and classify the multiple signals simultaneously. To illustrate, the combined spectrogram 152 enables the neural network 174 to perform multi-signal detection and identification of particular waveform instances, such as a first waveform instance 902 identified as the first FSK modulated signal, a second waveform instance 904 identified as the PSK modulated signal, and a third waveform instance 906 identified as the second FSK modulated signal, based on the one or more waveform signatures associated with each of the waveform instances 902, 904, and 906.

In accordance with some aspects, crossing radar pulses does not hinder signal classification in a multi-signal environment. As shown in FIG. 10, a diagram 1000 illustrates an example of the combined spectrogram 152 overlaid with multiple waveform detection results (e.g., labels and bounding boxes), such as generated by the device of FIG. 1 as the output 176, displayed at the display device 160, or a combination thereof. The combined spectrogram 152 enables identification, by the neural network 174, of each particular waveform instance based on one or more waveform signatures, such as the first signal 110A corresponding to a radar down-chirp, the second signal 110B corresponding to a PSK modulated signal, and the third signal 110C corresponding to a radar up-chirp. The combined spectrogram 152 enables the neural network 174 to perform multi-signal detection and identification of particular waveform instances, such as a first waveform instance 1002 identified as the radar down-chirp, a second waveform instance 1004 identified as the PSK modulated signal, and a third waveform instance 1006 identified as the radar up-chirp.

Figure 11:
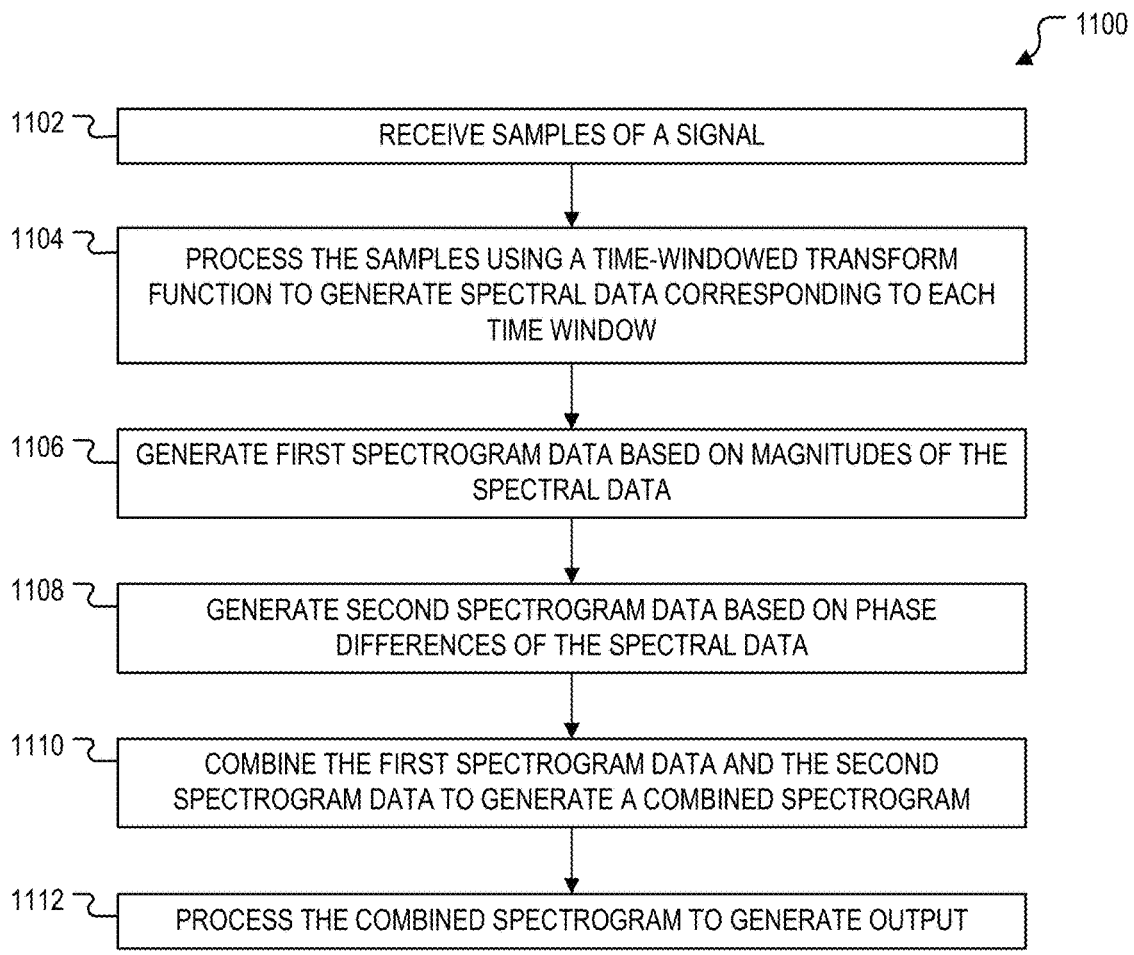
FIG. 11 is a flow diagram of a first example of a method of signal processing based on combined spectrograms according to a particular implementation.

FIG. 11 is a flow diagram of a first example of a method 1100 of signal processing based on combined spectrograms according to a particular implementation. The method 1100 can be initiated, performed, or controlled by the device 102 or a portion thereof, such as the processor 120.

The method 1100 includes, at block 1102, receiving samples of a signal. For example, the device 102 receives the samples 108 of the signal 110 via the receiver 104.

The method 1100 includes, at block 1104, processing the samples using a time-windowed transform function to generate spectral data corresponding to each time window. For example, the processor 120 processes the samples 108 using the time-windowed transform function 130 to generate the spectral data 134 corresponding to each time window 132.

The method 1100 includes, at block 1106, generating first spectrogram data based on magnitudes of the spectral data. For example, the magnitude spectrogram generator 140 generates the first spectrogram data 144 based on magnitudes of the spectral data 134.

The method 1100 includes, at block 1108, generating second spectrogram data based on phase differences of the spectral data. For example, the phase spectrogram generator 142 generates the second spectrogram data 146 based on phase differences of the spectral data 134.

The method 1100 includes, at block 1110, combining the first spectrogram data and the second spectrogram data to generate a combined spectrogram. As an example, the combiner 150 combines the first spectrogram data 144 and the second spectrogram data 146 to generate the combined spectrogram 152. In a particular example, the combined spectrogram provides a high-fidelity image of signal information.

The method 1100 includes, at block 1112, processing the combined spectrogram to generate output. For example, the spectrogram processor 170, the image processor 172, the neural network 174, or a combination thereof, process the combined spectrogram 152 to generate the output 176.

By generating the combined spectrogram including magnitude and phase difference information, the method 1100 enables enhanced detection of features in received signals as compared to use of conventional spectrograms that omit phase difference data. The combined spectrogram can be processed via a neural network trained to perform preamble detection, waveform identification, emitter identification, or a combination thereof. Additional resolution and detection capability is provided in implementations in which multiple combined spectrograms generated using different time window sizes are processed as multi-channel image data, such as described with reference to FIGS. 5-7.

Figure 12:
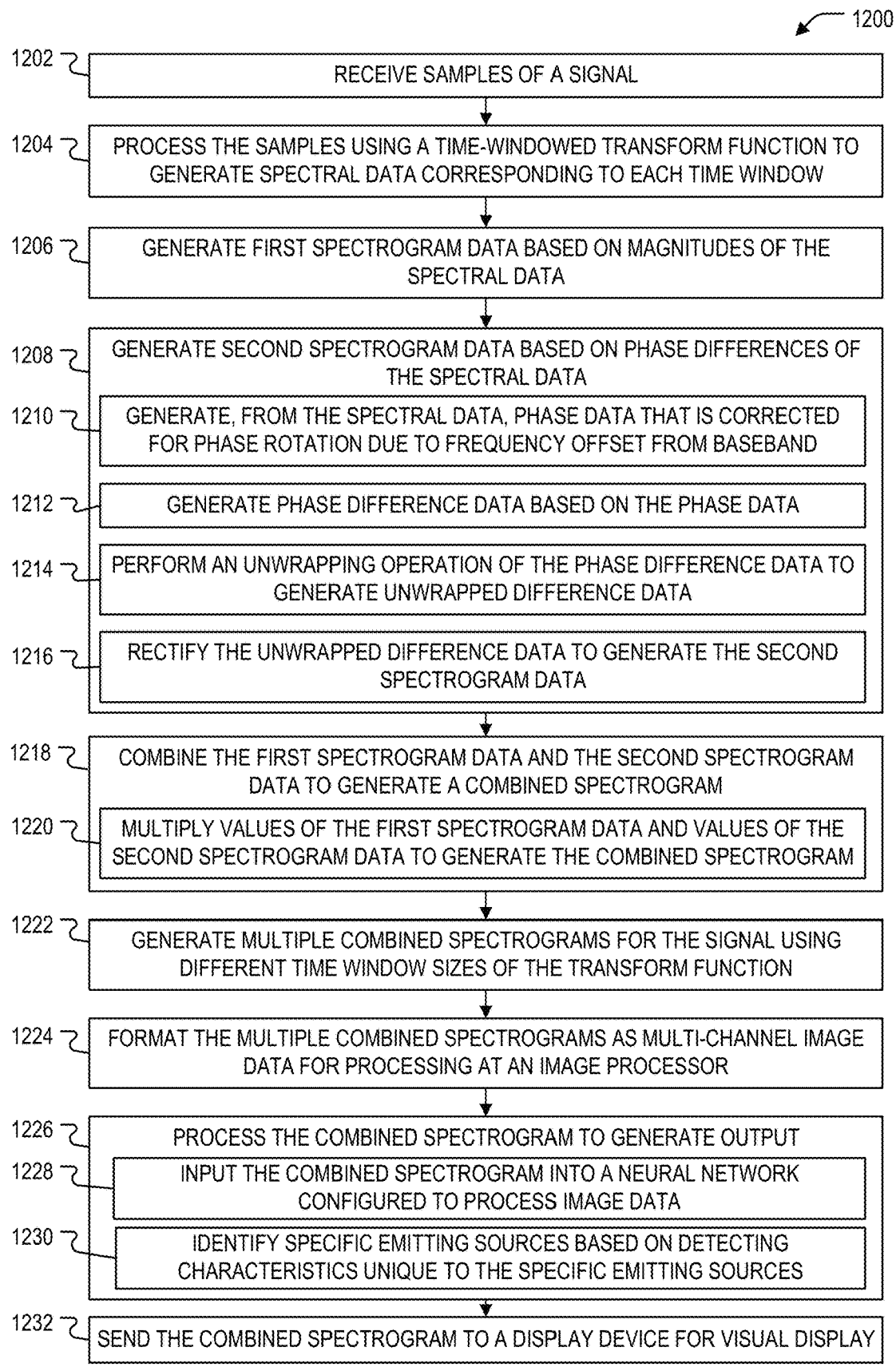
FIG. 12 is a flow diagram of a second example of a method of signal processing based on combined spectrograms according to a particular implementation.

FIG. 12 is a flow diagram of a second example of a method 1200 of signal processing based on combined spectrograms according to a particular implementation. The method 1200 can be initiated, performed, or controlled by the device 102 or a portion thereof, such as the processor 120.

The method 1200 includes, at block 1202, receiving samples of a signal. For example, the device 102 receives the samples 108 of the signal 110 via the receiver 104.

The method 1200 includes, at block 1204, processing the samples using a time-windowed transform function to generate spectral data corresponding to each time window. For example, the processor 120 processes the samples 108 using the time-windowed transform function 130 to generate the spectral data 134 corresponding to each time window 132.

The method 1200 includes, at block 1206, generating first spectrogram data based on magnitudes of the spectral data. For example, the magnitude spectrogram generator 140 generates the first spectrogram data 144 based on magnitudes of the spectral data 134.

The method 1200 includes, at block 1208, generating second spectrogram data based on phase differences of the spectral data. For example, the phase spectrogram generator 142 generates the second spectrogram data 146 based on phase differences of the spectral data 134.

In a particular implementation, generating the second spectrogram data includes, at block 1210, generating, from the spectral data, phase data that is corrected for phase rotation due to frequency offset from baseband. For example, the phase spectrogram generator 142 can perform the phase data generation operation 302 of FIG. 3 to generate the phase data 304.

Generating the second spectrogram data can also include, at block 1212, generating phase difference data based on the phase data. For example, the phase spectrogram generator 142 can perform the phase differencing operation 312 of FIG. 3 to generate the phase difference data 314.

Generating the second spectrogram data can also include, at block 1214, performing an unwrapping operation of the phase difference data to generate unwrapped difference data. For example, the phase spectrogram generator 142 can perform the unwrapping operation 322 of FIG. 3 to generate the unwrapped difference data 324.

Generating the second spectrogram data can also include, at block 1216, rectifying the unwrapped difference data to generate the second spectrogram data. For example, the phase spectrogram generator 142 can perform the rectifying operation 332 of FIG. 3 to generate the second spectrogram data 146.

The method 1200 includes, at block 1218, combining the first spectrogram data and the second spectrogram data to generate a combined spectrogram. As an example, the combiner 150 combines the first spectrogram data 144 and the second spectrogram data 146 to generate the combined spectrogram 152. In a particular example, combining the first spectrogram data and the second spectrogram data includes, at block 1220, multiplying values of the first spectrogram data and values of the second spectrogram data to generate the combined spectrogram. In a particular example, the combined spectrogram provides a high-fidelity image of signal information.

In some implementations, the method 1200 includes, at block 1222, generating multiple combined spectrograms for the signal using different time window sizes of the transform function. For example, as described with reference to FIG. 5, the transform function 130 can generate multiple sets of spectral data using multiple time windows 132 having distinct sizes 520, such as the first time window 132A having the first size 520A, the second time window 132B having the second size 520B, and the third time window 132C having the third size 520C, which are processed at the spectrogram generator 136 to generate the first combined spectrogram 152A, the second combined spectrogram 152B, and the third combined spectrogram 152C, respectively.

In some implementations, the method 1200 includes, at block 1224, formatting the multiple combined spectrograms as multi-channel image data for processing at an image processor. In some implementations, each particular bin of one channel of the multi-channel image data corresponds to a same time and frequency block as the corresponding bins of the other channels of the multi-channel image data. For example, as described with reference to FIG. 5, the multi-channel image formatter 502 formats the first combined spectrogram 152A, the second combined spectrogram 152B, and the third combined spectrogram 152C to generate the multi-channel image data 510.

The method 1200 includes, at block 1226, processing the combined spectrogram to generate output. For example, the spectrogram processor 170, the image processor 172, the neural network 174, or a combination thereof, process the combined spectrogram (e.g., by processing the multi-channel image that includes the combined spectrograms 152A, 152B, and 152C) to generate the output 176.

In some implementations, processing the combined spectrogram includes, at block 1228, inputting the combined spectrogram into a neural network configured to process image data, such as the neural network 174. In a particular example, the combined spectrogram enables detection, by the neural network, of one or more waveform signatures, and the detection of one or more waveform signatures includes preamble detection. For example, detection of the preamble 810 and detection of the waveform signatures 812, 814 of FIG. 8 can be performed by the neural network 174. In a particular example, the combined spectrogram enables identification, by the neural network, of a particular waveform instance, such as the waveform instances 902, 904, and 906 of FIG. 9, based on the one or more waveform signatures.

In some implementations, the combined spectrogram enables detection, by the neural network, of the presence of multiple emitting sources, such as the sources 106A, 106B, and 106C. In a particular example, processing the combined spectrogram includes, at block 1230, identifying specific emitting sources of the multiple emitting sources based on detecting, within the combined spectrogram, characteristics unique to the specific emitting sources.

In some implementations, the method 1200 includes, at block 1232, sending the combined spectrogram (e.g., as part of the multi-channel image) to a display device for visual display. For example, the device 102 sends the combined spectrogram 152 to the display device 160 for visual display.

By generating the combined spectrogram including magnitude and phase difference information, the method 1200 enables enhanced detection of features in received signals as compared to use of conventional spectrograms that omit phase difference data. The combined spectrogram can be processed via a neural network trained to perform preamble detection, waveform identification, emitter identification, or a combination thereof, in a multi-signal environment. Generating multiple combined spectrograms based on using different time window sizes and formatted as multi-channel image data enables use of image processing techniques for feature detection and signal classification.

Figure 13:
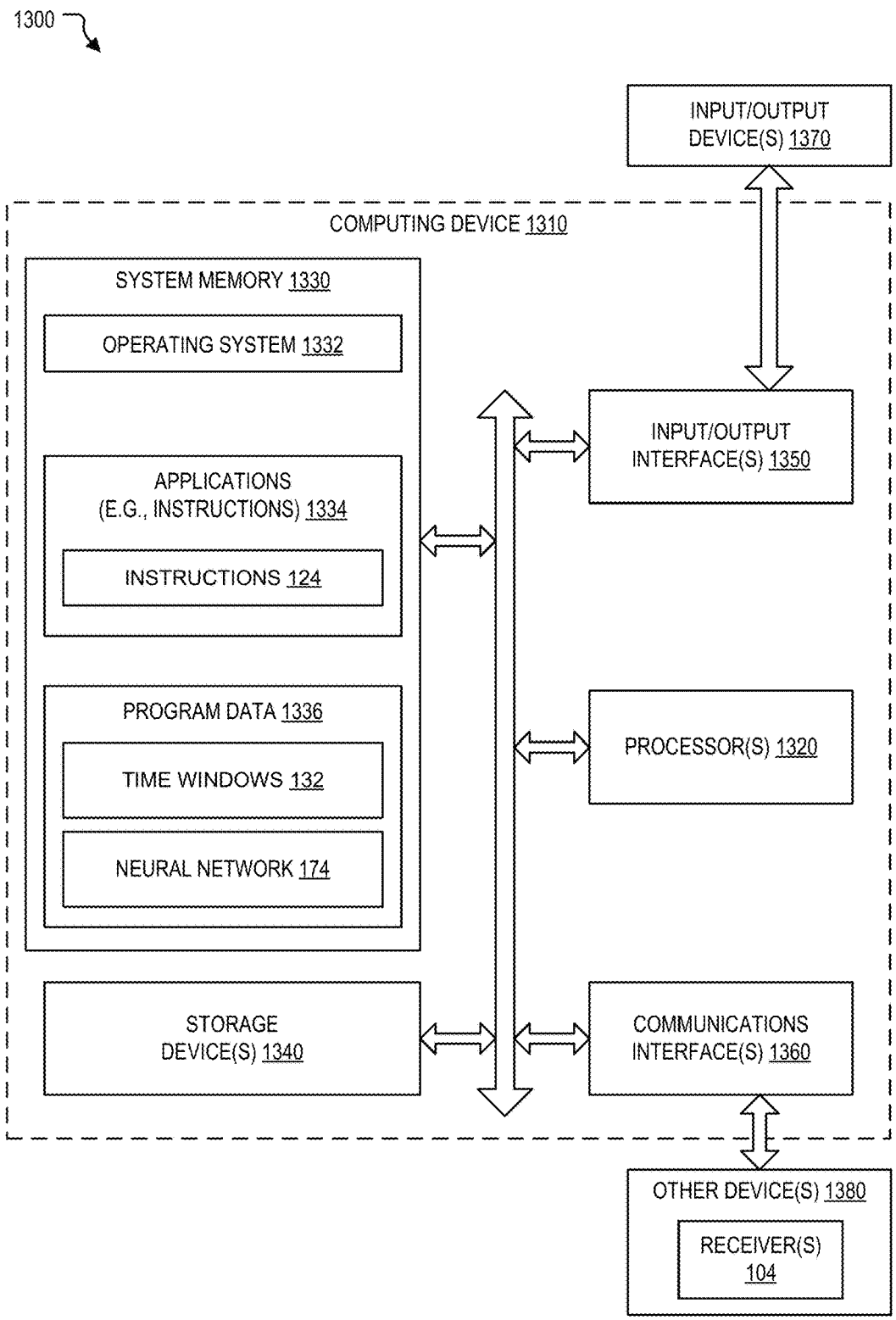
FIG. 13 is a block diagram of a computing environment including a computing device configured to support aspects of signal processing based on combined spectrograms.

FIG. 13 is a block diagram of a computing environment 1300 including a computing device 1310 configured to support aspects of signal processing based on combined spectrograms. In the particular implementation illustrated in FIG. 13, the computing device 1310 can include, correspond to, or be included within the device 102 of FIG. 1. Alternatively, the computing device 1310 can support operation of the system 100, such as by performing some of the calculations to generate the combined spectrogram 152 or providing machine instructions to the spectrogram processor 170 that are used to process the combined spectrogram 152. The computing device 1310 is configured to support aspects of computer-implemented methods and computer-executable program instructions (or code) according to the present disclosure. For example, the computing device 1310, or portions thereof, is configured to execute instructions 124 to initiate, perform, or control one or more operations described with reference to FIGS. 1-12.

The computing device 1310 includes one or more processors 1320, which can include or correspond to the processor(s) 120 of FIG. 1 or can be distinct from the processor(s) 120 of FIG. 1. The processor(s) 1320 are configured to communicate with system memory 1330, one or more storage devices 1340, one or more input/output interfaces 1350, one or more communications interfaces 1360, or any combination thereof. The system memory 1330 includes volatile memory devices (e.g., random access memory (RAM) devices), nonvolatile memory devices (e.g., read-only memory (ROM) devices, programmable read-only memory, and flash memory), or both. The system memory 1330 stores an operating system 1332, which can include a basic input/output system for booting the computing device 1310 as well as a full operating system to enable the computing device 1310 to interact with users, other programs, and other devices. In the example illustrated in FIG. 13, the system memory 1330 stores program data 1336, such as the time windows 132, the neural network 174, or both, which can be used to generate the spectral data 134, the combined spectrogram 152, the output 176, or a combination thereof. of FIG. 1.

The system memory 1330 includes one or more applications 1334 (e.g., sets of instructions) executable by the processor(s) 1320. As an example, the one or more applications 1334 include instructions executable by the processor(s) 1320 to initiate, control, or perform one or more operations described with reference to FIGS. 1-12, such as the instructions 124.

The one or more storage devices 1340 include nonvolatile storage devices, such as magnetic disks, optical disks, or flash memory devices. In a particular example, the storage devices 1340 include both removable and non-removable memory devices. The storage devices 1340 are configured to store an operating system, images of operating systems, applications (e.g., one or more of the applications 1334), and program data (e.g., the program data 1336). In a particular aspect, the system memory 1330, the storage devices 1340, or both, include tangible (e.g., non-transitory) computer-readable media. In this context, tangible computer-readable media refers to a physical device or composition of matter not merely a signal. In a particular aspect, one or more of the storage devices 1340 are external to the computing device 1310.

The one or more input/output interfaces 1350 enable the computing device 1310 to communicate with one or more input/output devices 1370 to facilitate user interaction. For example, the one or more input/output interfaces 1350 can include a display interface, an input interface, or both. For example, the input/output interface 1350 is adapted to receive input from a user, to receive input from another computing device, or a combination thereof. In some implementations, the input/output interface 1350 conforms to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces ("IEEE" is a registered trademark of The Institute of Electrical and Electronics Engineers, Inc. of Piscataway, N.J.). In some implementations, the input/output device 1370 includes one or more user interface devices and displays, including some combination of buttons, keyboards, pointing devices, displays, speakers, microphones, touch screens, and other devices. In some implementations, the one or more input/output devices 1370 include the display device 160.

The processor(s) 1320 are configured to communicate with other devices 1380 (e.g., other computing devices or controllers) via the one or more communications interfaces 1360. For example, the communications interface(s) 1360 can include a wired or wireless network interface. The other devices 1380 can include, for example, the one or more receivers 104. In the example illustrated in FIG. 13, the computing device 1310 can communicate with (e.g., receive the samples 108 from, send commands to) the one or more receivers 104 via the communication interface(s) 1360. In other examples, the computing device 1310 communicates with the one or more receivers 104 via the input/output interface(s) 1350.

In some implementations, a non-transitory computer readable medium stores instructions that, when executed by one or more processors, cause the one or more processors to initiate, perform, or control operations to perform part or all of the functionality described above. For example, the instructions can be executable to implement one or more of the operations or methods described with reference to FIGS. 1-12. In a particular example, the instructions are executable by the processor 120, the processor 1320, or both, to receive samples of a signal and to process the samples using a time-windowed transform function to generate spectral data corresponding to each time window. The instructions are executable by the one or more processors to generate first spectrogram data based on magnitudes of the spectral data and to generate second spectrogram data based on phase differences of the spectral data. The instructions are also executable by the one or more processors to combine the first spectrogram data and the second spectrogram data to generate a combined spectrogram and to process the combined spectrogram to generate output. In some implementations, part or all of one or more of the operations or methods described with reference to FIGS. 1-12 can be implemented by one or more processors, one or more graphics processing units, one or more digital signal processors) executing instructions, by dedicated hardware circuitry, or any combination thereof.

In accordance with the disclosed examples, an apparatus includes means for receiving samples of a signal. For example, the means for receiving the samples can correspond to the device 102, the processor 120, circuitry configured to perform the transform function 130, the processor 1320, the input/output interface 1350, the communications interface 1360, one or more other devices or circuits configured to receive the samples, or a combination thereof.

The apparatus includes means for processing the samples using a time-windowed transform function to generate spectral data corresponding to each time window. For example, the means for processing the samples can correspond to the processor 120, circuitry configured to perform the transform function 130, the processor 1320, one or more other devices or circuits configured to generate the spectral data 134, or a combination thereof.

The apparatus includes means for generating first spectrogram data based on magnitudes of the spectral data. For example, the means for generating the first spectrogram data can include the processor 120, the spectrogram generator 136, the magnitude spectrogram generator 140, the processor 1320, one or more other devices or circuits configured to generate the first spectrogram data 144, or a combination thereof.

The apparatus includes means for generating second spectrogram data based on phase differences of the spectral data. For example, the means for generating the second spectrogram data can include the processor 120, the spectrogram generator 136, the phase spectrogram generator 142, the processor 1320, one or more other devices or circuits configured to generate the second spectrogram data 146, or a combination thereof.

The apparatus includes means for combining the first spectrogram data and the second spectrogram data to generate a combined spectrogram. For example, the means for combining can include the processor 120, the spectrogram generator 136, combiner 150, the processor 1320, one or more other devices or circuits configured to combine the first spectrogram data 144 and the second spectrogram data 146, or a combination thereof.

The apparatus includes means for processing the combined spectrogram to generate output. For example, the means for processing the combined spectrogram can include the processor 120, the spectrogram processor 170, the image processor 172, the neural network 174, the multi-channel image formatter 502, the deep convolutional neural network 608, the DCNN 708, the processor 1320, one or more other devices or circuits configured to process the combined spectrogram to generate output, or a combination thereof.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations can be utilized and derived from the disclosure, such that structural and logical substitutions and changes can be made without departing from the scope of the disclosure. For example, method operations can be performed in a different order than shown in the figures or one or more method operations can be omitted. Accordingly, the disclosure and the figures are to be regarded as illustrative rather than restrictive.

According to Clause 1, a device (102) for signal processing includes: a memory (122) configured to store instructions (124); and one or more processors (120) configured to execute the instructions to: receive samples (108) of a signal (110); process the samples using a time-windowed transform function (130) to generate spectral data (134) corresponding to each time window (132); generate first spectrogram data (144) based on magnitudes of the spectral data; generate second spectrogram data (146) based on phase differences of the spectral data; combine the first spectrogram data and the second spectrogram data to generate a combined spectrogram (152); and process the combined spectrogram to generate output (176).

Clause 2 includes the device of Clause 1, wherein the one or more processors are configured to multiply values of the first spectrogram data and values of the second spectrogram data to generate the combined spectrogram.

Clause 3 includes the device of Clause 1 or Clause 2, wherein the one or more processors are configured to generate multiple combined spectrograms (152A, 152B, 152C) for the signal using different time window sizes (520A, 520B, 520C) of the transform function.

Clause 4 includes the device of Clause 3, wherein the one or more processors are configured to format the multiple combined spectrograms as multi-channel image data (510) for processing at an image processor (172).

Clause 5 includes the device of Clause 4, wherein each particular bin of one channel of the multi-channel image data corresponds to a same time and frequency block as the corresponding bins of the other channels of the multi-channel image data.

Clause 6 includes the device of any of Clauses 1 to 5, wherein the one or more processors are further configured to: generate, from the spectral data, phase data (304) that is corrected for phase rotation due to frequency offset from baseband; generate phase difference data (314) based on the phase data; perform an unwrapping operation (322) of the phase difference data to generate unwrapped difference data (324); and rectify the unwrapped difference data to generate the second spectrogram data.

Clause 7 includes the device of any of Clauses 1 to 6, wherein the combined spectrogram provides a high-fidelity image of signal information.

Clause 8 includes the device of any of Clauses 1 to 7, wherein the one or more processors are further configured to send the combined spectrogram to a display device (160) for visual display.

Clause 9 includes the device of any of Clauses 1 to 8, wherein the one or more processors are further configured to input the combined spectrogram into a neural network (174) configured to process image data.

Clause 10 includes the device of Clause 9, wherein the combined spectrogram enables detection, by the neural network, of one or more waveform signatures (812, 814), and wherein the detection of one or more waveform signatures includes preamble (810) detection.

Clause 11 includes the device of Clause 10, wherein the combined spectrogram enables identification, by the neural network, of a particular waveform instance (902, 904) based on the one or more waveform signatures.

Clause 12 includes the device of any of Clauses 9 to 11, wherein the combined spectrogram enables detection, by the neural network, of the presence of multiple emitting sources (106A, 106B, 106C).

Clause 13 includes the device of Clause 12, wherein the one or more processors are configured to identify specific emitting sources of the multiple emitting sources based on detecting, within the combined spectrogram, characteristics unique to the specific emitting sources.

According to Clause 14, a method (1100) of signal processing includes: receiving (1102) samples (108) of a signal (110); processing (1104) the samples using a time-windowed transform function (130) to generate spectral data (134) corresponding to each time window (132); generating (1106) first spectrogram data (144) based on magnitudes of the spectral data; generating (1108) second spectrogram data (146) based on phase differences of the spectral data; combining (1110) the first spectrogram data and the second spectrogram data to generate a combined spectrogram (152); and processing (1112) the combined spectrogram to generate output (176).

Clause 15 includes the method of Clause 14 and further includes multiplying (1220) values of the first spectrogram data and values of the second spectrogram data to generate the combined spectrogram.

Clause 16 includes the method of Clause 14 or Clause 15, and further includes generating (1222) multiple combined spectrograms (152A, 152B, 152C) for the signal using different time window sizes (520A, 520B, 520C) of the transform function.

Clause 17 includes the method of Clause 16, and further includes formatting (1224) the multiple combined spectrograms as multi-channel image data (510) for processing at an image processor (172).

Clause 18 includes the method of Clause 17, wherein each particular bin of one channel of the multi-channel image data corresponds to a same time and frequency block as the corresponding bins of the other channels of the multi-channel image data.

Clause 19 includes the method of any of Clauses 14 to 18, and further includes: generating (1210), from the spectral data, phase data (304) that is corrected for phase rotation due to frequency offset from baseband; generating (1212) phase difference data (314) based on the phase data; performing (1214) an unwrapping operation (322) of the phase difference data to generate unwrapped difference data (324); and rectifying (1216) the unwrapped difference data to generate the second spectrogram data.

Clause 20 includes the method of any of Clauses 14 to 19, wherein the combined spectrogram provides a high-fidelity image of signal information.

Clause 21 includes the method of any of Clauses 14 to 20, and further includes sending (1232) the combined spectrogram to a display device (160) for visual display.

Clause 22 includes the method of any of Clauses 14 to 21, and further includes inputting (1228) the combined spectrogram into a neural network (174) configured to process image data.

Clause 23 includes the method of Clause 22, wherein the combined spectrogram enables detection, by the neural network, of one or more waveform signatures (812, 814), and wherein the detection of one or more waveform signatures includes preamble (810) detection.

Clause 24 includes the method of Clause 23, wherein the combined spectrogram enables identification, by the neural network, of a particular waveform instance (902, 904) based on the one or more waveform signatures.

Clause 25 includes the method of any of Clauses 22 to 24, wherein the combined spectrogram enables detection, by the neural network, of the presence of multiple emitting sources (106A, 106B, 106C).

Clause 26 includes the method of Clause 25, and further includes identifying (1230) specific emitting sources of the multiple emitting sources based on detecting, within the combined spectrogram, characteristics unique to the specific emitting sources.

According to Clause 27, a computer-readable storage device (122) stores instructions (124) that, when executed by one or more processors (120), cause the one or more processors to: receive samples (108) of a signal (110); process the samples using a time-windowed transform function (130) to generate spectral data (134) corresponding to each time window (132); generate first spectrogram data (144) based on magnitudes of the spectral data; generate second spectrogram data (146) based on phase differences of the spectral data; combine the first spectrogram data and the second spectrogram data to generate a combined spectrogram (152); and process the combined spectrogram to generate output (176).

Clause 28 includes the computer-readable storage device of Clause 27, wherein the instructions, when executed by the one or more processors, further cause the one or more processors to multiply (1220) values of the first spectrogram data and values of the second spectrogram data to generate the combined spectrogram.

Clause 29 includes the computer-readable storage device of Clause 27 or Clause 28, wherein the instructions, when executed by the one or more processors, further cause the one or more processors to generate (1222) multiple combined spectrograms (152A, 152B, 152C) for the signal using different time window sizes (520A, 520B, 520C) of the transform function.

Clause 30 includes the computer-readable storage device of Clause 29, wherein the instructions, when executed by the one or more processors, further cause the one or more processors to format (1224) the multiple combined spectrograms as multi-channel image data (510) for processing at an image processor (172).

Clause 31 includes the computer-readable storage device of Clause 30, wherein each particular bin of one channel of the multi-channel image data corresponds to a same time and frequency block as the corresponding bins of the other channels of the multi-channel image data.

Clause 32 includes the computer-readable storage device of any of Clauses 27 to 31, wherein the instructions, when executed by the one or more processors, further cause the one or more processors to generate (1210), from the spectral data, phase data (304) that is corrected for phase rotation due to frequency offset from baseband; generate (1212) phase difference data (314) based on the phase data; perform (1214) an unwrapping operation (322) of the phase difference data to generate unwrapped difference data (324); and rectify (1216) the unwrapped difference data to generate the second spectrogram data.

Clause 33 includes the computer-readable storage device of any of Clauses 27 to 32, wherein the combined spectrogram provides a high-fidelity image of signal information.

Clause 34 includes the computer-readable storage device of any of Clauses 27 to 33, wherein the instructions, when executed by the one or more processors, further cause the one or more processors to send (1232) the combined spectrogram to a display device (160) for visual display.

Clause 35 includes the computer-readable storage device of any of Clauses 27 to 34, wherein the instructions, when executed by the one or more processors, further cause the one or more processors to input (1228) the combined spectrogram into a neural network (174) configured to process image data.

Clause 36 includes the computer-readable storage device of Clause 35, wherein the combined spectrogram enables detection, by the neural network, of one or more waveform signatures (812, 814), and wherein the detection of one or more waveform signatures includes preamble (810) detection.

Clause 37 includes the computer-readable storage device of Clause 36, wherein the combined spectrogram enables identification, by the neural network, of a particular waveform instance (902, 904) based on the one or more waveform signatures.

Clause 38 includes the computer-readable storage device of any of Clauses 35 to 37, wherein the combined spectrogram enables detection, by the neural network, of the presence of multiple emitting sources (106A, 106B, 106C).

Clause 39 includes the computer-readable storage device of Clause 38, wherein the instructions, when executed by the one or more processors, further cause the one or more processors to identify (1230) specific emitting sources of the multiple emitting sources based on detecting, within the combined spectrogram, characteristics unique to the specific emitting sources.

Moreover, although specific examples have been illustrated and described herein, it should be appreciated that any subsequent arrangement designed to achieve the same or similar results can be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features can be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. A device for signal processing comprising:
  a memory configured to store instructions; and
  one or more processors configured to execute the instructions to:
    receive samples of a signal;
    process the samples using a time-windowed transform function to generate spectral data corresponding to each time window;
    generate first spectrogram data based on magnitudes of the spectral data;
    generate, from the spectral data, phase data that is corrected for phase rotation due to frequency offset from baseband;
    generate phase difference data based on the phase data;
    perform an unwrapping operation of the phase difference data to generate unwrapped difference data;
    rectify the unwrapped difference data to generate second spectrogram data;
    combine the first spectrogram data and the second spectrogram data to generate a combined spectrogram; and
    process the combined spectrogram to generate an output that identifies one or more signal types associated with the signal, identifies one or more emitters associated with the signal, or both.

2. The device of claim 1, wherein the one or more processors are configured to multiply values of the first spectrogram data and values of the second spectrogram data to generate the combined spectrogram.

3. The device of claim 1, wherein the one or more processors are configured to generate multiple combined spectrograms for the signal using different time window sizes of the transform function.

4. The device of claim 3, wherein the one or more processors are configured to format the multiple combined spectrograms as multi-channel image data for processing at an image processor.

5. The device of claim 4, wherein each particular bin of one channel of the multi-channel image data corresponds to a same time and frequency block as the corresponding bins of the other channels of the multi-channel image data.

6. The device of claim 1, wherein the combined spectrogram provides a high-fidelity image of signal information.

7. The device of claim 1, wherein the one or more processors are further configured to send the combined spectrogram to a display device for visual display.

8. The device of claim 1, wherein the one or more processors are further configured to input the combined spectrogram into a neural network configured to process image data.

9. The device of claim 8, wherein the combined spectrogram enables detection, by the neural network, of one or more waveform signatures, and wherein the detection of one or more waveform signatures includes preamble detection.

10. The device of claim 9, wherein the combined spectrogram enables identification, by the neural network, of a particular waveform instance based on the one or more waveform signatures.

11. The device of claim 8, wherein the combined spectrogram enables detection, by the neural network, of a presence of multiple emitting sources.

12. The device of claim 11, wherein the one or more processors are configured to identify specific emitting sources of the multiple emitting sources based on detecting, within the combined spectrogram, characteristics unique to the specific emitting sources.

13. A method of signal processing comprising:
receiving samples of a signal;
processing the samples using a time-windowed transform function to generate spectral data corresponding to each time window;
generating first spectrogram data based on magnitudes of the spectral data;
generating, from the spectral data, phase data that is corrected for phase rotation due to frequency offset from baseband;
generating phase difference data based on the phase data;
performing an unwrapping operation of the phase difference data to generate unwrapped difference data;
rectifying the unwrapped difference data for generating second spectrogram data based on phase differences of the spectral data;
combining the first spectrogram data and the second spectrogram data to generate a combined spectrogram; and
processing the combined spectrogram to generate an output that identifies one or more signal types associated with the signal, identifies one or more emitters associated with the signal, or both.

14. The method of claim 13, further comprising generating multiple combined spectrograms for the signal using different time window sizes of the transform function.

15. The method of claim 14, further comprising formatting the multiple combined spectrograms as multi-channel image data for processing at an image processor.

16. The method of claim 13, wherein the combined spectrogram enables detection, by a neural network, of one or more waveform signatures, and wherein the detection of one or more waveform signatures includes preamble detection.

17. The method of claim 13, further comprising multiplying values of the first spectrogram data and values of the second spectrogram data to generate the combined spectrogram.

18. The method of claim 13, further comprising inputting the combined spectrogram into a neural network configured to process image data, wherein the combined spectrogram enables detecting, by the neural network, of one or more waveform signatures, and wherein the detecting of one or more waveform signatures includes preamble detection.

19. A computer-readable storage device storing instructions that, when executed by one or more processors, cause the one or more processors to:
receive samples of a signal;
process the samples using a time-windowed transform function to generate spectral data corresponding to each time window;
generate first spectrogram data based on magnitudes of the spectral data;
generate, from the spectral data, phase data that is corrected for phase rotation due to frequency offset from baseband;
generate phase difference data based on the phase data;
perform an unwrapping operation of the phase difference data to generate unwrapped difference data;
rectify the unwrapped difference data to generate second spectrogram data based on phase differences of the spectral data;
combine the first spectrogram data and the second spectrogram data to generate a combined spectrogram; and
process the combined spectrogram to generate an output that identifies one or more signal types associated with the signal, identifies one or more emitters associated with the signal, or both.

20. The computer-readable storage device of claim 19, wherein the instructions, when executed by the one or more processors, further cause the one or more processors to generate multiple combined spectrograms for the signal using different time window sizes of the transform function.

* * * * *